United States Patent
Hatakeyama et al.

(10) Patent No.: US 9,146,468 B2
(45) Date of Patent: *Sep. 29, 2015

(54) RESIST UNDERLAYER FILM COMPOSITION AND PATTERNING PROCESS USING THE SAME

(71) Applicant: SHIN-ETSU CHEMICAL CO., LTD., Tokyo (JP)

(72) Inventors: Jun Hatakeyama, Jyoetsu (JP); Daisuke Kori, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 224 days.

This patent is subject to a terminal disclaimer.

(21) Appl. No.: 13/632,556

(22) Filed: Oct. 1, 2012

(65) Prior Publication Data

US 2013/0087529 A1 Apr. 11, 2013

(30) Foreign Application Priority Data

Oct. 11, 2011 (JP) .................. 2011-224290

(51) Int. Cl.
*G03F 7/09* (2006.01)
*G03F 7/11* (2006.01)
*G03F 7/20* (2006.01)
*G03F 7/30* (2006.01)
*G03F 7/36* (2006.01)
*G03F 7/095* (2006.01)
*H01L 21/027* (2006.01)
*H01L 21/311* (2006.01)
*C08J 3/24* (2006.01)

(52) U.S. Cl.
CPC *G03F 7/091* (2013.01); *G03F 7/09* (2013.01); *G03F 7/094* (2013.01); *G03F 7/095* (2013.01); *G03F 7/11* (2013.01); *G03F 7/2041* (2013.01); *G03F 7/30* (2013.01); *G03F 7/36* (2013.01); *H01L 21/0271* (2013.01); *H01L 21/31116* (2013.01); *H01L 21/31138* (2013.01); *H01L 21/31144* (2013.01); *C08J 3/24* (2013.01)

(58) Field of Classification Search
None
See application file for complete search history.

(56) References Cited

U.S. PATENT DOCUMENTS

| | | |
|---|---|---|
| 2002/0086934 A1 | 7/2002 | Kawaguchi et al. |
| 2002/0106909 A1 | 8/2002 | Kato et al. |
| 2002/0119612 A1 | 8/2002 | Ohuchi et al. |
| 2004/0191479 A1 | 9/2004 | Hatakeyama et al. |
| 2004/0241577 A1 | 12/2004 | Hatakeyama et al. |
| 2004/0247900 A1 | 12/2004 | Ogihara et al. |
| 2004/0253461 A1 | 12/2004 | Ogihara et al. |
| 2004/0259037 A1 | 12/2004 | Hatakeyama et al. |
| 2005/0255712 A1 | 11/2005 | Kato et al. |
| 2005/0277058 A1 | 12/2005 | Iwabuchi et al. |
| 2006/0014106 A1 | 1/2006 | Hatakeyama et al. |
| 2006/0019195 A1 | 1/2006 | Hatakeyama et al. |
| 2006/0204891 A1 | 9/2006 | Hatakeyama |
| 2007/0122740 A1 | 5/2007 | Hatakeyama et al. |
| 2007/0134916 A1 | 6/2007 | Iwabuchi et al. |
| 2007/0172759 A1 | 7/2007 | Ogihara et al. |
| 2007/0275325 A1 | 11/2007 | Hatakeyama et al. |
| 2008/0118860 A1 | 5/2008 | Harada et al. |
| 2013/0089820 A1* | 4/2013 | Hatakeyama et al. ........ 430/296 |

FOREIGN PATENT DOCUMENTS

| | | |
|---|---|---|
| JP | A-2001-40293 | 2/2001 |
| JP | A-2002-14474 | 1/2002 |
| JP | A-2002-214777 | 7/2002 |
| JP | A-2002-334869 | 11/2002 |
| JP | B2-3504247 | 3/2004 |
| JP | A-2004-205658 | 7/2004 |
| JP | A-2004-205676 | 7/2004 |
| JP | A-2004-205685 | 7/2004 |
| JP | A-2004-310019 | 11/2004 |
| JP | A-2004-354554 | 12/2004 |
| JP | A-2005-10431 | 1/2005 |
| JP | A-2005-15779 | 1/2005 |
| JP | A-2005-18054 | 1/2005 |
| JP | A-2005-128509 | 5/2005 |
| JP | A-2005-250434 | 9/2005 |
| JP | A-2005-352104 | 12/2005 |
| JP | A-2006-53543 | 2/2006 |
| JP | A-2006-227391 | 8/2006 |
| JP | A-2006-259249 | 9/2006 |

| JP | A-2006-259482 | 9/2006 |
| JP | A-2006-285075 | 10/2006 |
| JP | A-2006-285095 | 10/2006 |
| JP | A-2006-293298 | 10/2006 |
| JP | A-2007-65161 | 3/2007 |
| JP | A-2007-99741 | 4/2007 |
| JP | A-2007-163846 | 6/2007 |
| JP | A-2007-171895 | 7/2007 |
| JP | A-2007-199653 | 8/2007 |
| JP | A-2007-226170 | 9/2007 |
| JP | A-2007-226204 | 9/2007 |
| JP | A-2007-316282 | 12/2007 |
| JP | A-2008-26600 | 2/2008 |
| JP | A-2008-76850 | 4/2008 |
| JP | A-2008-96684 | 4/2008 |
| JP | A-2008-111103 | 5/2008 |
| JP | A-2008-158002 | 7/2008 |
| WO | WO 2004/066377 A1 | 8/2004 |

OTHER PUBLICATIONS

Lynch et al., "Properties and Performance of Near UV Reflectivity Control Layers," *SPIE*, vol. 2195, pp. 225-229, 1994.
Johnson, "Thermolysis of Positive Photoresists," *SPIE Advances in Resist Technology*, vol. 469, pp. 72-79, 1984.
Abe et al., "Sub-55-nm Etch Process Using Stacked-Mask Process," *Dry Process International Symposium*, vol. 2-05, pp. 11-12, 2005.
Noda et al., "A Comment on the Structure of Glassy Carbon," *Glass Carbon Bull. Chem. Soc. JPN.*, vol. 41, No. 12, pp. 3023-3024, Dec. 1968.

* cited by examiner

*Primary Examiner* — Sin Lee
(74) *Attorney, Agent, or Firm* — Oliff PLC

(57) ABSTRACT

There is disclosed a resist underlayer film composition, the resist underlayer film composition contains a truxene compound having a substituted or an unsubstituted naphthol group as shown by the following general formula (1). There can be provided a resist underlayer film composition to form a resist underlayer film being capable of reducing reflectance and having high etching resistance, heat resistance.

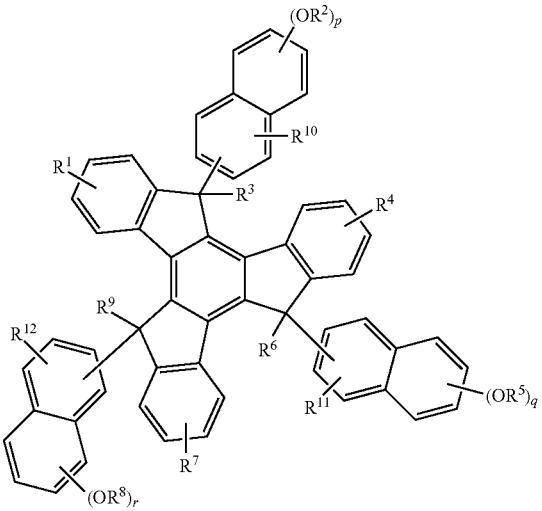

(1)

22 Claims, 4 Drawing Sheets

FILM THICKNESS OF INTERMEDIATE LAYER (nm)

□ 0-1  ▨ 1-2  ▨ 2-3  ▪ 3-4  ▪ 4-5

INTERMEDIATE LAYER k

SUBSTRATE REFLECTANCE (%)

FILM THICKNESS OF UNDERLAYER FILM (nm)

□ 0-1  ▨ 1-2  ▨ 2-3  ▪ 3-4  ▪ 4-5

FILM THICKNESS OF INTERMEDIATE LAYER (nm)

SUBSTRATE REFLECTANCE (%)

RESIST UNDERLAYER FILM COMPOSITION AND PATTERNING PROCESS USING THE SAME

BACKGROUND OF THE INVENTION

1. Field of the Invention

The present invention relates to a resist underlayer film composition and a patterning process using this.

2. Description of the Related Art

In a recent trend to a higher integration and a higher processing speed of LSI whereby requiring miniaturization of a pattern rule, a lithography using photo-exposure which is currently used as a general-purpose technology is approaching to a limit of resolution inherent to wavelength of a light source.

As to the light source for a lithography used in resist patterning, photo-exposure using a light source of a g-beam (436 nm) or an i-beam (365 nm) of a mercury lamp has been used. As the means for further miniaturization, shift of the exposure light to a shorter wavelength is considered to be effective; and thus, a lithography using as the light source thereof, in place of the i-beam (365 nm), a KrF excimer laser (248 nm), which has a shorter wavelength than the i-beam, especially an ArF excimer laser (193 nm), or further an immersion method using an ArF excimer laser with NA of 1.35 have been used, whereby mass-production using a double patterning process with which the pattern pitch thereby obtained is doubled has been started.

On the other hand, it has been known from the past that a bilayer process is effective to form a pattern having a high aspect ratio on a non-planar substrate; and further, to develop the bilayer resist film by a general alkaline developer solution, a silicone polymer compound having a hydrophilic group such as a hydroxyl group and a carboxyl group is necessary.

As to a chemically amplified positive resist composition of a silicone type, a chemically amplified positive resist composition of a silicone type for a KrF excimer laser using a base resin having a part of a phenolic hydroxyl group of polyhydroxybenzyl silsesquioxane thereof, which is a stable alkaline-soluble silicone polymer, protected with a t-Boc group and being combined with an acid generator was proposed. As for an ArF excimer laser, a positive resist composition based on a silsesquioxane having a cyclohexyl carboxylic acid group thereof substituted with an acid-labile group is proposed. Further, as for an $F_2$ laser, a positive resist composition based on a silsesquioxane having a hexafluoroisopropanol group as a soluble group is proposed. The polymer mentioned above includes in its main chain a polysilsesquioxane moiety including a ladder skeleton formed by polycondensation of a trialkoxy silane or a trihalogenated silane.

As to the resist base polymer having a silicon pendant on its side chain, a silicon-containing (meth)acrylate ester polymer is proposed.

As to the resist underlayer film of the bilayer process, it comprises a hydrocarbon compound capable of being etched with an oxygen gas; and in addition, because it becomes a mask when a substrate thereunder is etched, it needs to have a high etching resistance. In etching by an oxygen gas, it needs to be comprised of only a hydrocarbon, not containing a silicon atom. Further, in order to improve line-width controllability of a silicon-containing resist film in the upper layer and to reduce concavity and convexity of a pattern side wall and pattern fall due to a standing wave, it also needs to have a function as an bottom antirefrective coating; and thus, specifically reflectance from the resist underlayer film to the resist upper layer film needs to be controlled at the level of 1% or lower.

Here, calculation results of the reflectance of film thickness till the maximum of 500 nm are shown in FIG. 3 and FIG. 4. In FIG. 3, a substrate reflectance when the k-value of the resist underlayer film is fixed at 0.3 while the n-value is changed from 1.0 to 2.0 in the vertical axis and film thickness from 0 to 500 nm in the horizontal axis is shown, based on the assumption that wavelength of the exposure light is 193 nm, and the n-value reflectance and the k-value reflectance of the resist upper layer film are 1.74 and 0.02, respectively. When the resist underlayer film for the bilayer process having film thickness of 300 nm or more is assumed, an optimum value exists in the n-value range of 1.6 to 1.9 to have the reflectance of 1% or less, the range being the same level or a slightly higher as compared with the resist upper layer film.

In FIG. 4, reflectance when the n-value of the resist underlayer film is fixed at 1.5 while the k-value is changed from 0 to 0.8 is shown. When the resist underlayer film for the bilayer process having film thickness of 300 nm or more is assumed, reflectance of 1% or less is possible in the k-value range of 0.24 to 0.15. On the other hand, the optimum k-value of the bottom antirefrective coating for a monolayer resist used in a thin film of about 40 nm is 0.4 to 0.5, which is different from the optimum k-value of the resist underlayer film for the bilayer process used in the film thickness of 300 nm or more. In the resist underlayer film for the bilayer process, it is shown that a resist underlayer film having further lower k-value, namely a further transparent resist underlayer film is necessary.

However, etching resistance of an acrylate ester is lower as compared with a polyhydroxy styrene in substrate etching, and top of it, to lower the k-value, considerable amount of the acrylate ester must be copolymerized; and as a result, the resistance in substrate etching is substantially deteriorated. The etching resistance has an effect not only on etching rate but also on surface roughness after etching. Worsening of surface roughness after etching which is caused by copolymerization of the acrylate ester became a serious problem.

On the other hand, a trilayer process having a laminate comprising a resist upper layer film of a monolayer resist not containing a silicon, a silicon-containing resist intermediate film thereunder, and a resist underlayer film of an organic film thereunder is proposed. Generally, a monolayer resist has better resolution than a silicon-containing resist; and thus, in the trilayer process, the monolayer resist having high resolution can be used as an exposure imaging layer. As to the resist intermediate film, a spin-on-glass (SOG) film is used, whereby many SOG films are proposed.

Here, optimum optical constants of the underlayer film to suppress the substrate reflection in the trilayer process are different from those in the bilayer process. There is no difference between the bilayer process and the trilayer process in the object to suppress the substrate reflection as much as possible, specifically to the level of 1% or lower; but the antireflective effect is afforded to only the resist underlayer film in the bilayer process, while in the trilayer process the antireflective effect can be afforded to any one of the resist intermediate film and the resist underlayer film or both.

A material for a silicon-containing film afforded with the antireflective effect has been proposed. Generally, the antireflective effect is higher in the bottom antirefrective coating of a multilayer than in that of a monolayer; and thus, this is widely used as the bottom antirefrective coating of an optical material in industry. A high antireflective effect can be obtained by affording the antireflective effect to both the resist intermediate film and the resist underlayer film.

If a function of the bottom antirefrective coating can be afforded to the silicon-containing intermediate film in the trilayer process, it is not necessary to afford the highest effect as the bottom antirefrective coating to the resist underlayer film as in the case of the bilayer process. In the trilayer process, the resist underlayer film is required to have a high etching resistance during the substrate processing rather than to have the effect as the bottom antirefrective coating.

Because of this, a novolak resin containing many aromatic groups thereby having a high etching resistance has been used as the resist underlayer film for the trilayer process.

Here, the substrate reflectance is shown in FIG. 5 when the k-value of the resist intermediate film is changed.

When a low value of 0.2 or less is made as the k-value of the resist intermediate film and the film thickness is set appropriately, sufficient antireflective effect with the level of 1% or lower can be obtained.

Usually, to suppress the reflection to the level of 1% or lower in the bottom antirefrective coating with the film thickness of 100 nm or less, k-value needs to be 0.2 or more (see FIG. 4); but in the resist intermediate film of the trilayer process in which a certain degree of reflection can be suppressed by the resist underlayer film, the k-value of less than 0.2 becomes the optimum value.

Next, change of reflectance when both film thicknesses of the resist intermediate film and of the resist underlayer film are changed is shown in FIG. 6 and FIG. 7 for the cases with the k-value of the resist underlayer film being 0.2 and 0.6.

The resist underlayer film having k-value of 0.2 in FIG. 6 assumes the optimum resist underlayer film for the bilayer process, while k-value of 0.6 of the resist underlayer film in FIG. 7 is nearly equal to the k-value of a novolak or a polyhydroxy styrene at 193 nm.

Film thickness of the resist underlayer film changes with topography of the substrate, but film thickness of the resist intermediate film hardly changes so that application thereof for coating may be effected with the predetermined film thickness.

Here, the resist underlayer film having a higher k-value (the case of 0.6) can suppress the reflection to the level of 1% or lower with a thinner film thickness. In the case that k-value of the resist underlayer film is 0.2 with film thickness thereof being 250 nm, film thickness of the resist intermediate film needs to be thicker to obtain reflectance of 1%. However, when film thickness of the resist intermediate film is increased as mentioned above, burden to the uppermost resist film during dry etching at the time of processing of the resist intermediate film is large; and thus, this is not desirable.

FIGS. 6 and FIG. 7, showing reflection in dry photo-exposure with NA of the exposure instrument's lens being 0.85, show that reflectance of 1% or less can be obtained regardless of k-value of the resist underlayer film by optimizing n-value, k-value, and film thickness of the resist intermediate film for the trilayer process. However, NA of the projection lens is beyond 1.0 due to an immersion lithography so that angle of an incident light not only to the resist but also to the bottom antirefrective coating under the resist becomes shallower. The bottom antirefrective coating suppresses reflection not only by absorption by the film itself but also by compensation action due to a light interference effect. A slant light has a smaller light interference effect thereby leading to larger reflection. Among the films in the trilayer process, a film playing an antireflection role by using the light interference is the resist intermediate film. The resist underlayer film is too thick to use the interference action so that there is no antireflective effect by compensation action due to the light interference effect. Reflection from the resist underlayer film surface needs to be suppressed; and for this, k-value of the resist underlayer film needs to be less than 0.6 and n-value thereof needs to be nearly equal to that of the upper resist intermediate film. Excessively high transparency due to excessively small k-value generates reflection from the substrate; and thus, optimum value of k-value is in the range of about 0.25 to about 0.48 in the case of NA of the immersion exposure being 1.3. As to the re-value, the target value thereof in both the intermediate film and the underlayer film is nearly equal to 1.7 of the resist n-value.

A benzene ring has strong absorption; and thus, k-value of a cresol novolak and a polyhydroxy styrene is more than 0.6. A naphthalene ring is one example among those having higher transparency at 193 nm and higher etching resistance than a benzene ring. For example, resist underlayer films having a naphthalene ring and an anthracene ring are proposed in the Patent literature 1. According to our measurement, k-values of the naphthol-cocondensed novolak resin and of the polyvinyl naphthalene resin are in the range of 0.3 to 0.4. In addition, n-values of the naphthol-cocondensed novolak resin and of the polyvinyl naphthalene resin at 193 nm are low; n-value of the naphthol-cocondensed novolak is 1.4, while that of the polyvinyl naphthalene resin is even as low as 1.2. For example, an acenaphthylene polymer shown in the Patent literature 2 and the Patent literature 3 has n-value of 1.5 and k-value of 0.4 at 193 nm, which are nearly equal to the target value. An underlayer film having a high n-value and a low k-value thereby having low transparency, while having a high etching resistance, is wanted.

A resist underlayer film composition having a bisnaphthol group is proposed in the Patent literature 4. This has both n-value and k-value nearly equal to the target values whereby having characteristic of excellent etching resistance.

In the case that there is a level difference on the founding substrate to be processed, this different level needs to be made flattened by the resist underlayer film. By flattening the resist underlayer film, variance of film thickness of the resist intermediate film formed thereon and of the photoresist film, which is the resist upper layer film, can be suppressed so that a focus margin in lithography can be made larger.

However, in the amorphous carbon underlayer film formed by a CVD method using such a raw material as a methane gas, an ethane gas, and an acetylene gas, to fill up the different level so as to make it flat is difficult. On the other hand, formation of the resist underlayer film by a spin coating method has a merit that concavity and convexity of the substrate can be filled up. Further, in order to improve a fill-up property of an application-type material, a method in which a novolak having a low molecular weight and a wide molecular weight distribution and a method in which a low-molecular weight compound having a low-melting point is blended to a base polymer are proposed.

It is well known that a novolak resin is cured by crosslinking intermolecularly only by heating. Here, a crosslinking mechanism, in which a phenoxy radical is generated in the hydroxyl group of a cresol novolak by heating and this radical is then migrated to the methylene connecting group in the novolak resin by resonance whereby these methylene groups are crosslinked therebetween by radical coupling, is reported. In the P Patent literature 5, a patterning process using the underlayer film whose carbon density is increased by a dehydrogenation reaction or a dehydration condensation reaction of a polycyclic aromatic compound such as a polyarylene, a naphthol novolak, and a hydroxyl anthracene by heating is reported.

A glass-like carbon film is formed by heating at temperature of 800° C. or higher (nonpatent literature 1). However, in view of the effect to device damage and wafer deformation, upper temperature limit of heating in lithography wafer process is 600° C. or lower, or preferably 500° C. or lower.

As the process line width narrows further, a phenomenon that the resist underlayer film twists or bends during the time of etching of the substrate to be processed by using the resist underlayer film as a mask is reported (nonpatent literature 2). A phenomenon that a hydrogen atom of the resist underlayer film is displaced with a fluorine atom during the time of substrate etching by a fluorocarbon gas is shown. It may be supposed that surface of the resist underlayer film is changed to a sort of Teflon (registered trade name) so that the underlayer film swells due to increase of its volume and the glass transition temperature thereof is lowered to cause twisting of a finer pattern. In the foregoing reference literature, it is shown that twisting can be avoided by using a resist underlayer film having low hydrogen content. The amorphous carbon film formed by a CVD method is very effective to avoid twisting because hydrogen atoms in the film can be made extremely small. However, because the CVD method is poor in a fill-up property of the level difference as mentioned before, and in addition, in view of cost of the CVD instrument and the footprint thereof, introduction thereof is sometimes difficult. If the twisting problem can be solved by the underlayer film composition which can form a film by coating, especially by a spin coating method, it has a large merit in simplification of the process and the instrument thereof.

A study of a multilayer process to form a hard mask on the resist underlayer film by a CVD method is underway. In a silicon hard mask (silicon oxide film, silicon nitride film, and silicon oxynitride film) too, an inorganic hard mask formed by a CVD method and so on has higher etching resistance than a hard mask formed by a spin coating method. In addition, there is a case that a substrate to be processed is of a low dielectric film thereby polluting the photoresist (poisoning); in this case, the CVD film has a higher effect as a shielding film to avoid the poisoning.

In view of the above, a study is underway as to the process in which the resist underlayer film is formed by spin coating to make it flat and then an inorganic hard mask intermediate film as the resist intermediate film is formed thereon by a CVD method. When the inorganic hard mask intermediate film is formed by a CVD method, heating of the substrate at the lowest temperature of 300° C., or usually at 400° C., is considered to be necessary especially to form a nitride film. Accordingly, when the resist underlayer film is formed by a spin coating method, heat resistance of 400° C. is necessary; however, not only a usual cresol novolak and naphthol novolak but also a highly heat-resistant fluorene bisphenol novolak cannot withstand the heating at 400° C., whereby resulting in large film loss after heating. In view of the above, a resist underlayer film which can withstand high temperature heating during formation of the inorganic hard mask intermediate film by a CVD method is wanted.

Because of problems of film loss and resin deterioration after heating caused by poor heat resistance as mentioned above, in the past, heat treatment of the resist underlayer film composition has been carried out usually at 300° C. or lower (preferably in the range of 80 to 300° C.). However, problems of film loss after treatment by a solvent and of pattern twist during the time of substrate etching have not been solved yet.

As discussed above, a material to form a resist underlayer film having optimum n-value and k-value as the bottom antirefrective coating, an excellent fill-up property, excellent etching resistance and solvent resistance, and heat resistance to withstand high temperature during formation of the inorganic hard mask intermediate film by a CVD method and so forth, while not twisting during the time of substrate etching is wanted; and wanted also is a patterning process for it.

A positive resist having a truxene structure is proposed (Patent literature 6). A resist based on a truxene having a hydroxyl group thereof substituted with an acid-labile group is introduced as an EB resist and an EUV resist having an excellent etching resistance. Among underlayer-forming materials having a plurality of etching resistant bisphenols, a truxene bisphenol compound is shown (Patent literature 7); and thus, a truxene compound is receiving an attention.

[Patent literature 1] Japanese Patent Laid-Open Publication No. 2002-14474.

[Patent literature 2] Japanese Patent Laid-Open Publication No. 2001-40293

[Patent literature 3] Japanese Patent Laid-Open Publication No. 2002-214777

[Patent literature 4] Japanese Patent Laid-Open Publication No. 2007-199653

[Patent literature 5] Japanese Patent No. 3504247

[Patent literature 6] Japanese Patent Laid-Open Publication No. 2008-76850

[Patent literature 7] Japanese Patent Laid-Open Publication No. 2006-285075

[nonpatent literature 1] Glass Carbon Bull. Chem. Soc. JPN., 41(12), 3023-3024 (1968)

[nonpatent literature 2] Proc. of Symp. Dry Process (2005), p 11.

SUMMARY OF THE INVENTION

The present invention was made in view of the situation as mentioned above, and has objects to provide a resist underlayer film composition to form a resist underlayer film being capable of reducing reflectance and having high etching resistance, heat resistance, and solvent resistance while not twisting especially during the time of substrate etching and to provide a patterning process using this.

In order to address the problems as mentioned above, the present invention provides a resist underlayer film composition, the resist underlayer film composition used in a patterning process to form a pattern on a substrate wherein a resist underlayer film is formed on the substrate by using the resist underlayer film composition, at least a resist upper layer film is formed on the resist underlayer film by using a photoresist composition, after the resist upper layer film is exposed and developed to form a pattern, the pattern formed on the resist upper layer film is transferred to the resist underlayer film, and then the pattern transferred to the resist underlayer film is transferred to the substrate; wherein the resist underlayer film composition contains a truxene compound having a substituted or an unsubstituted naphthol group as shown by the following general formula (1),

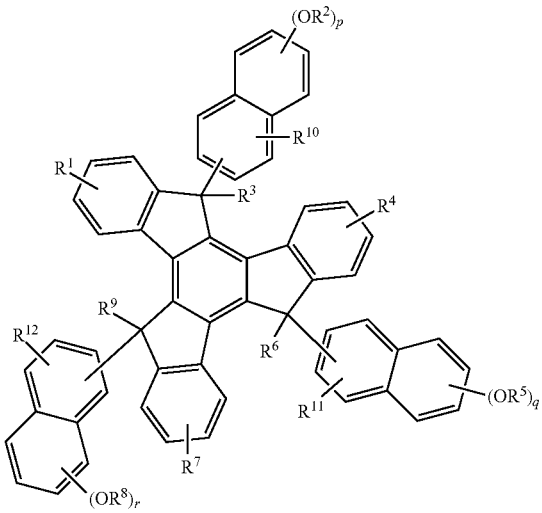

(1)

provided that: in the general formula (1), $R^1$, $R^4$, $R^7$, $R^{10}$, $R^{11}$, and $R^{12}$ represent the same or different groups of a hydrogen atom, a linear, a branched, or a cyclic alkyl group having 1 to 10 carbon atoms, an aryl group having 6 to 10 carbon atoms, an alkenyl group having 2 to 10 carbon atoms, a hydroxyl group, an alkoxy group, an acyloxy group, a cyano group, a nitro group, an amino group, or a halogen atom; $R^2$, $R^5$, and $R^8$ represent the same or different groups of a hydrogen atom, a linear, a branched, or a cyclic alkyl group having 1 to 6 carbon atoms, an acyl group, a glycidyl group, or an acid-labile group; $R^3$, $R^6$, and $R^9$ represent the same or different groups of a hydrogen atom, a hydroxyl group, a linear, a branched, or a cyclic alkyl group having 1 to 10 carbon atoms, an alkoxy group, an alkenyl group having 2 to 10 carbon atoms, an alkynyl group having 2 to 10 carbon atoms, or an aryl group having 6 to 20 carbon atoms; and p, q, and r represent an integer of 1 to 6.

With this, a resist underlayer film composition to form a resist under layer film being capable of reducing reflectance, and having high etching resistance, heat resistance, and solvent resistance, while not twisting especially during the time of substrate etching can be obtained.

It is preferable that an organic solvent is further contained therein, and in addition, a crosslinking agent and an acid generator are further contained therein.

As mentioned above, it is preferable that the resist underlayer film composition of the present invention further contain an organic solvent, and in addition, a crosslinking agent and an acid generator to improve a spin coating property, a fill-up property of a non-planar substrate, and rigidity and solvent resistance of the film.

The present invention provides a patterning process, the patterning process to form a pattern on a substrate by a lithography, wherein, at least, a resist underlayer film is formed on the substrate by using the resist underlayer film composition, a resist intermediate film is formed on the resist underlayer film by using a silicon-containing resist intermediate film composition, a resist upper layer film is formed on the resist intermediate film by using a resist upper layer film material which is a photoresist composition, and after a pattern circuit area of the resist upper layer film is exposed, a resist pattern is formed on the resist upper layer film by developing with a developer, the resist intermediate film is etched by using the resist upper layer film formed with the resist pattern as a mask to form a pattern, the resist underlayer film is etched by using the resist intermediate film formed with the pattern as a mask to form a pattern, and further the substrate is etched by using the resist underlayer film formed with the pattern as a mask to form a pattern on the substrate.

If the patterning process using the trilayer process as mentioned above is used, a fine pattern with high precision can be formed on the substrate.

In addition, a patterning process, the patterning process to form a pattern on a substrate by a lithography, wherein, at least, a resist underlayer film is formed on the substrate by using the resist underlayer film composition, an inorganic hard mask intermediate film comprising any of a silicon oxide film, a silicon nitride film, and a silicon oxynitride film is formed on the resist underlayer film, a resist upper layer film is formed on the inorganic hard mask intermediate film by using a resist upper layer film material which is a photoresist composition, and after a pattern circuit area of the resist upper layer film is exposed, a resist pattern is formed on the resist upper layer film by developing with a developer, the inorganic hard mask intermediate film is etched by using the resist upper layer film formed with the resist pattern as a mask to form a pattern, the resist underlayer film is etched by using the inorganic hard mask intermediate film formed with the pattern as a mask to form a pattern, and further the substrate is etched by using the resist underlayer film formed with the pattern as a mask to form a pattern on the substrate.

If the resist underlayer film composition of the present invention is used when forming the inorganic hard mask as a resist intermediate film on the resist underlayer film, a patterning process using the resist underlayer film having a high heat resistance which can withstand high temperature processing during the time of forming the inorganic hard mask intermediate film can be obtained.

In addition, A patterning process, the patterning process to form a pattern on a substrate by a lithography, wherein, at least, a resist underlayer film is formed on the substrate by using the resist underlayer film composition, an inorganic hard mask intermediate film comprising any of a silicon oxide film, a silicon nitride film, and a silicon oxynitride film is formed on the resist underlayer film, an organic bottom antireflective coating (BARC) is formed on the inorganic hard mask intermediate film, a resist upper layer film is formed on the BARC film to form a four-layer resist film by using a resist upper layer film material which is a photoresist composition, and after a pattern circuit area of the resist upper layer film is exposed, a resist pattern is formed on the resist upper layer film by developing with a developer, the BARC film and the inorganic hard mask intermediate film are etched by using the resist upper layer film formed with the resist pattern as a mask to form a pattern on the inorganic hard mask intermediate film, the resist underlayer film is etched by using the inorganic hard mask intermediate film formed with the pattern as a mask to form a pattern, and further the substrate is etched by using the resist underlayer film formed with the pattern as a mask to form a pattern on the substrate.

As mentioned above, in the method of the present invention, the organic bottom antirefrective coating can be formed between the inorganic hard mask intermediate film and the resist upper layer film.

In addition, in formation of the inorganic hard mask intermediate film, the inorganic hard mask intermediate film comprising any of the silicon oxide film, the silicon nitride film, and the silicon oxynitride film is formed preferably by a CVD method or an ALD method.

By forming the inorganic hard mask intermediate film by a CVD method or an ALD method as mentioned above, a high etching resistance can be obtained.

It is preferable that in formation of the resist upper layer film, the resist upper layer film is formed by using the resist upper layer film material which is the photoresist composition not containing a silicon-containing polymer, and in etching of the resist underlayer film, the resist underlayer film is etched by an etching gas system mainly comprising an oxygen gas or a hydrogen gas by using the resist intermediate film formed with the pattern or the inorganic hard mask intermediate film formed with the pattern as a mask.

Accordingly, the silicon-containing inorganic hard mask is preferable because it shows etching resistance by an oxygen gas or a hydrogen gas during the time of etching of the resist underlayer film by using the inorganic hard mask intermediate film pattern as an etching mask.

As explained above, the resist underlayer film composition of the present invention can form the resist underlayer film being capable of reducing reflectance and having high etching resistance, heat resistance, and solvent resistance while not twisting especially during the time of substrate etching. Especially when the resist underlayer film composition of the present invention is used in a multilayer process of three or more layers, a resist underlayer film having optimum n-value and k-value as the bottom antirefrective coating, excellent fill-up property and etching resistance, and high heat resistance and solvent resistance, while suppressing generation of an outgoing gas during baking and not twisting during the time of substrate etching especially in a high aspect line which is thinner than 60 nm can be obtained.

In addition, according to the patterning process of the present invention, a fine pattern of high precision can be formed on the substrate. Especially this becomes the most suitable patterning process for exposure to a far UV beam, a KrF excimer laser beam (248 nm), an ArF excimer laser beam (193 nm), an $F_2$ laser beam (157 nm), a $Kr_2$ laser beam (146 nm), an $Ar_2$ laser beam (126 nm), a soft X-ray beam (EUV, 13.5 nm), an electron beam (EB), an X-ray beam, and so forth. In addition, the resist underlayer film composition of the present invention can form a resist underlayer film having a high heat resistance which can withstand high temperature processing during the time of forming the inorganic hard mask intermediate film by a CVD method and so on and thus, a patterning process wherein the resist underlayer film obtained by a spin coating method and so on is combined with the inorganic hard mask obtained by a CVD method and so on can be provided.

DESCRIPTION OF THE PREFERRED EMBODIMENTS

Hereinafter, the present invention will be explained in more detail. As mentioned above, as the patterning process to form a resist underlayer film of a multilayer resist film containing at least three layers, a patterning process to form a resist underlayer film having an excellent antireflective function and high etching resistance, heat resistance, solvent resistance, and fill-up property, while not twisting especially during the time of substrate etching, has been wanted.

To reduce pattern twisting during etching, reduction of hydrogen atom content in the underlayer film and baking at high temperature of 300° C. or higher have been considered effective.

Inventors of the present invention carried out an extensive investigation to achieve the objects mentioned above; and as a result, they found that a naphthol group-containing truxene compound shown by the following general formula (1) has a high crosslinking property whereby it can form a hard film by heating while having an extremely high heat resistance, and in addition, it has a property of accelerated evaporation of a solvent and so forth without thermal decomposition thereof when baked at high temperature of 300° C. or higher, and yet has high transparency, an excellent etching resistance, and an excellent twisting resistance of a fine pattern especially after etching, so that it is a promising material for the resist underlayer film.

Figure 1:
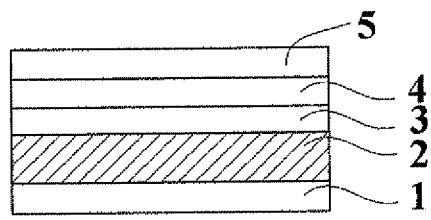
FIG. 1 is a view showing a substrate which a resist underlayer film is formed on the substrate by using the resist underlayer film composition of the present invention, a resist upper layer film is formed on the resist underlayer film.

Namely, a resist underlayer film composition of the present invention is the resist underlayer film composition used in a patterning process wherein, as shown in FIG. 1, resist underlayer film 3 is formed on layer to be processed 2 which is formed on substrate 1 by using the resist underlayer film composition, at least resist upper layer film 5 is formed on the resist underlayer film 3 by using a photoresist composition, after the resist upper layer film 5 is exposed and developed to form a pattern, the pattern formed on the resist upper layer film 5 is transferred to the resist underlayer film 3, and further, the pattern transferred to the resist underlayer film 3 is transferred to the layer to be processed 2 to form a pattern on the layer to be processed 2; wherein the resist underlayer film composition contains a truxene compound having a substituted or an unsubstituted naphthol group as shown by the following general formula (1),

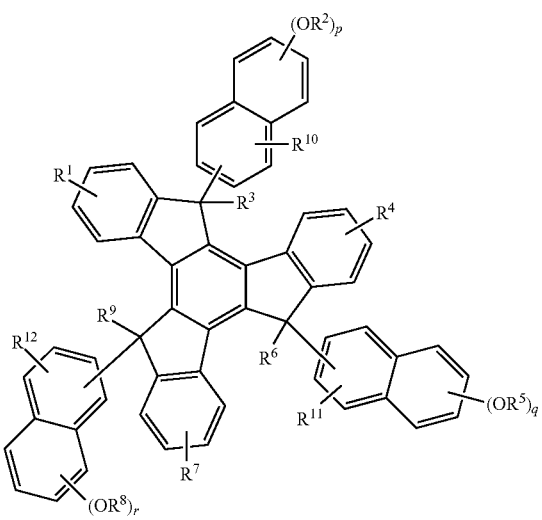

(1)

wherein $R^1$, $R^4$, $R^7$, $R^{10}$, $R^{11}$, and $R^{12}$ represent the same or different groups of a hydrogen atom, a linear, a branched, or a cyclic alkyl group having 1 to 10 carbon atoms, an aryl group having 6 to 10 carbon atoms, an alkenyl group having 2 to 10 carbon atoms, a hydroxyl group, an alkoxy group, an acyloxy group, a cyano group, a nitro group, an amino group, or a halogen atom; $R^2$, $R^5$, and $R^8$ represent the same or different groups of a hydrogen atom, a linear, a branched, or a cyclic alkyl group having 1 to 6 carbon atoms, an acyl group, a glycidyl group, or an acid-labile group; $R^3$, $R^6$, and $R^9$ represent the same or different groups of a hydrogen atom, a hydroxyl group, a linear, a branched, or a cyclic alkyl group having 1 to 10 carbon atoms, an alkoxy group, an alkenyl group having 2 to 10 carbon atoms, an alkynyl group having 2 to 10 carbon atoms, or an aryl group having 6 to 20 carbon atoms; and p, q, and r represent an integer of 1 to 6.

Especially, as the resist underlayer film composition suitably used for a patterning process of a trilayer process to form resist intermediate film 4 as shown in FIG. 1, the resist underlayer film composition of the present invention has high transparency and an excellent etching resistance in high energy beams with wavelength thereof being especially 300 nm or less; specifically, excimer laser beams of 248 nm, 193 nm, and 157 nm, a soft X-ray of 3 to 20 nm, an electron beam, and an X-ray.

Alternatively, the resist underlayer film composition of the present invention may contain, in addition to (A) a truxene compound having a substituted or an unsubstituted naphthol group shown by the general formula (1) as the essential component, (B) an organic solvent, and still in addition, may contain, in order to improve a spin coating property, a fill-up property of a non-planar substrate, and rigidity and solvent resistance of the film, (C) a base polymer, (D) a crosslinking agent, and (E) an acid generator.

In the general formula (1), each $R^1$, $R^4$, $R^7$, $R^{10}$, $R^{11}$, and $R^{12}$ represents the same or different groups of a hydrogen atom, a linear, a branched, or a cyclic alkyl group having 1 to 10 carbon atoms, an aryl group having 6 to 10 carbon atoms, an alkenyl group having 2 to 10 carbon atoms, a hydroxyl group, an alkoxy group, an acyloxy group, a cyano group, a nitro group, an amino group, or a halogen atom. As to the alkoxy group, a linear, a branched, or a cyclic alkoxy group having 2 to 10 carbon atoms is preferable; and as to the acyloxy group, a linear, a branched, or a cyclic acyloxy group having 2 to 10 carbon atoms is preferable.

Each $R^2$, $R^5$, and $R^8$ represents the same or different groups of a hydrogen atom, a linear, a branched, or a cyclic alkyl group having 1 to 6 carbon atoms, an acyl group, a glycidyl group, or an acid-labile group. As to the acyl group, a linear, a branched, or a cyclic acyl group having 2 to 10 carbon atoms is preferable; and as to the acid-labile group, a methoxymethyl group, an ethoxyethyl group, a t-butyl group, a t-butoxycarbonyl group, and so on are preferable.

In the general formula (1), $R^3$, $R^6$, and $R^9$ represent the same or different groups of a hydrogen atom, a hydroxyl group, a linear, a branched, or a cyclic alkyl group having 1 to 10 carbon atoms, an alkoxy group, an alkenyl group having 2 to 10 carbon atoms, an alkynyl group having 2 to 10 carbon atoms, or an aryl group having 6 to 20 carbon atoms. p, q, and r represent an integer of 1 to 6. As to the alkoxy group, a linear, a branched, or a cyclic alkoxy group having 1 to 10 carbon atoms is preferable. Meanwhile, a hydrogen atom of each of the alkyl group, the alkoxy group, the alkenyl group, the alkynyl group, or the aryl group shown by $R^3$, $R^6$, and $R^9$ may be substituted with a hydroxyl group and the like.

The truxene compound having a substituted or an unsubstituted naphthol group shown by the general formula (1) has a high carbon content ratio, whereby having excellent etching resistance, solubility, and crosslinking cure property. A truxene has a planar structure so that a high density stack thereof can be formed. With this, the etching resistance can be enhanced. The bonding part between the bisnaphthol and the truxene is in the form of a quaternary carbon cardo structure, by which the etching resistance thereof can be enhanced. In addition, because the naphthol groups face toward outside the molecule, the crosslinking reactivity thereof is so high that the film having high crosslinking density and rigidity can be obtained. A truxene is synthesized by condensation of three indanone molecules in the presence of an acid by heating. A truxene is oxidized to synthesize a truxenone, and then a carbonyl group thereof is reacted with a naphthol to synthesize a naphthol-substituted truxene. Alternatively, three molecules of 1,3-dioxoindan, in place of the indanone, are condensed to synthesize truxenone in a single step.

Specific example of the truxene compound having a substituted or an unsubstituted naphthol group shown by the general formula (1) includes those as shown below.

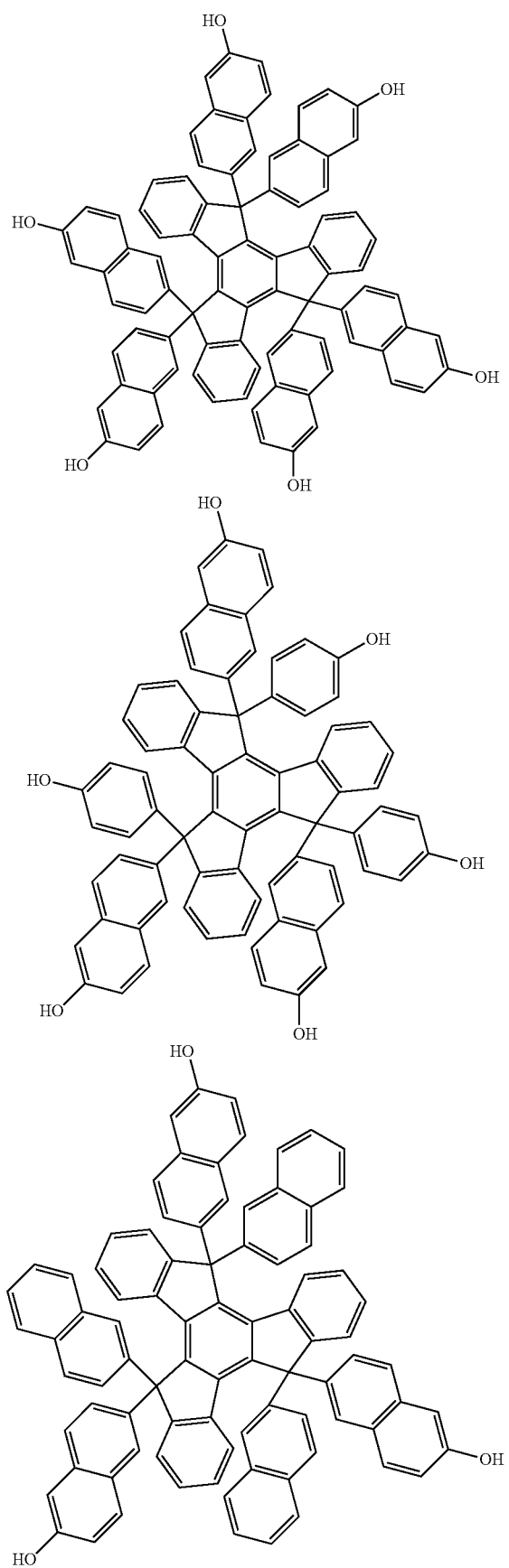
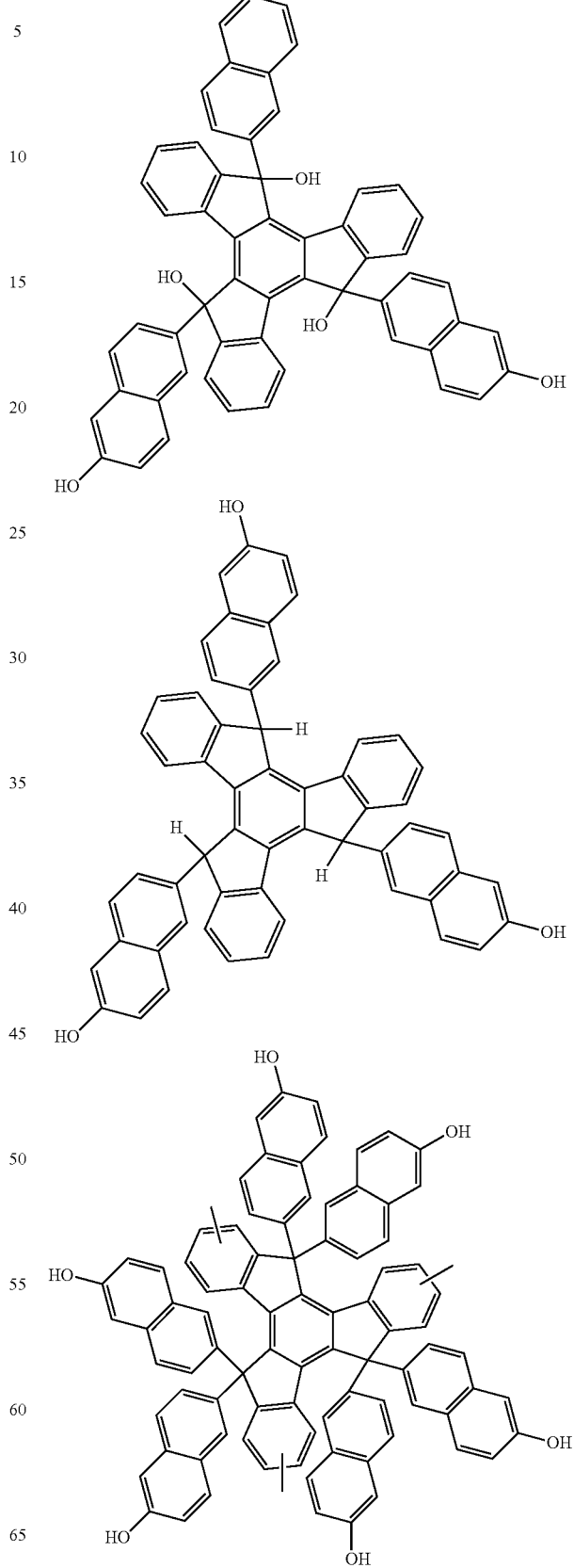

-continued
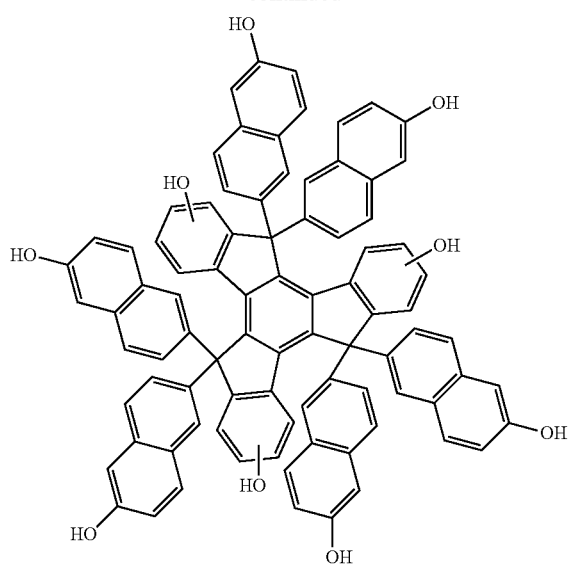
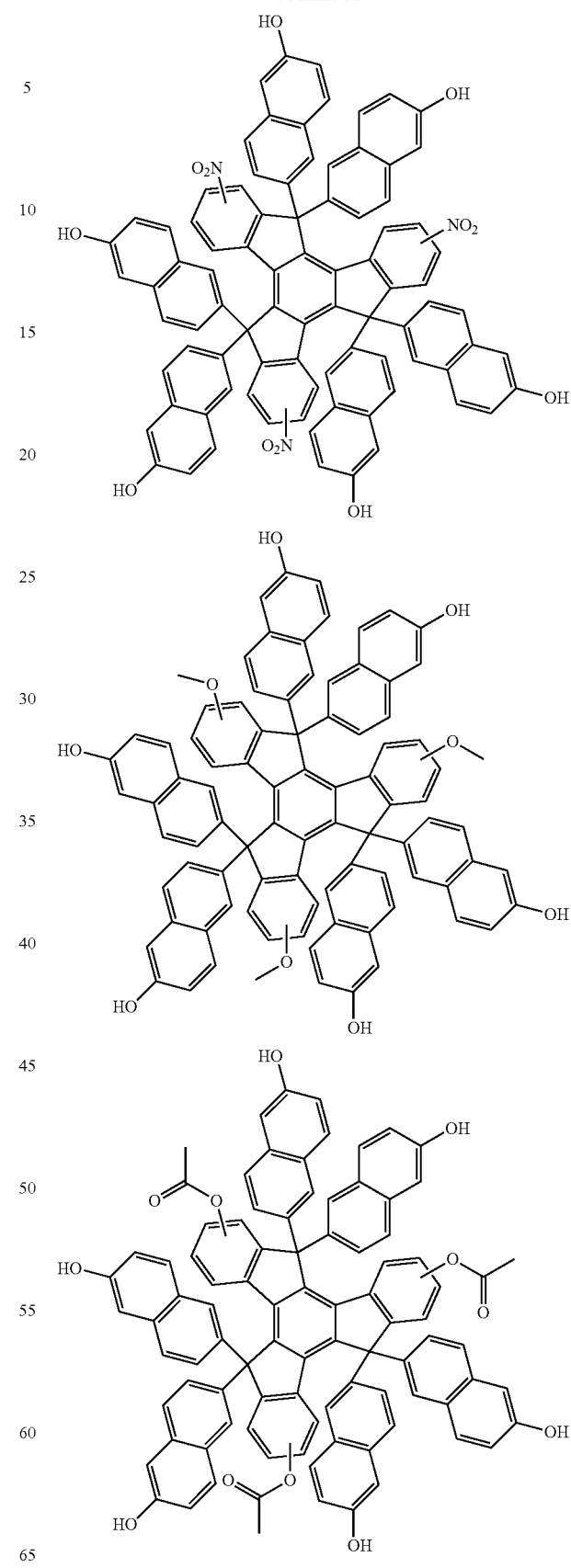

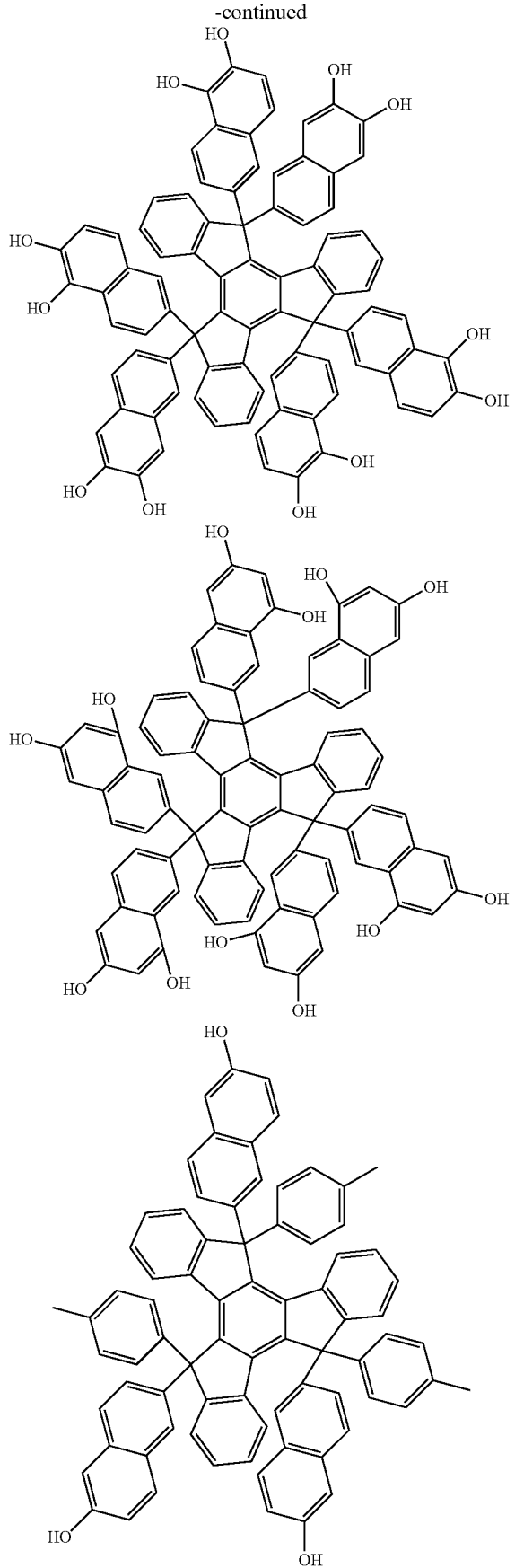
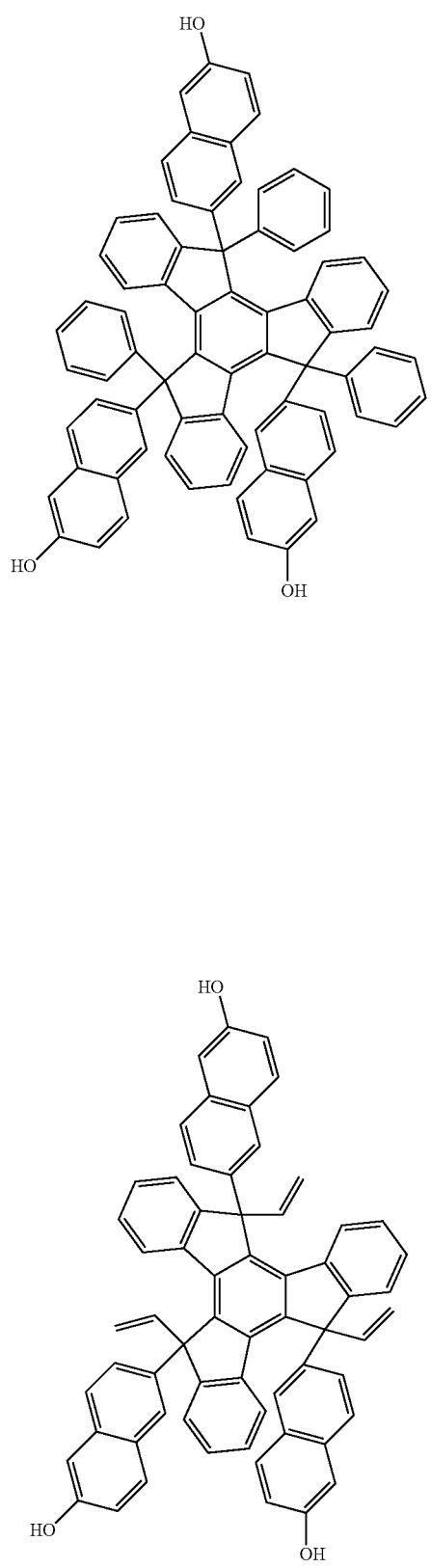

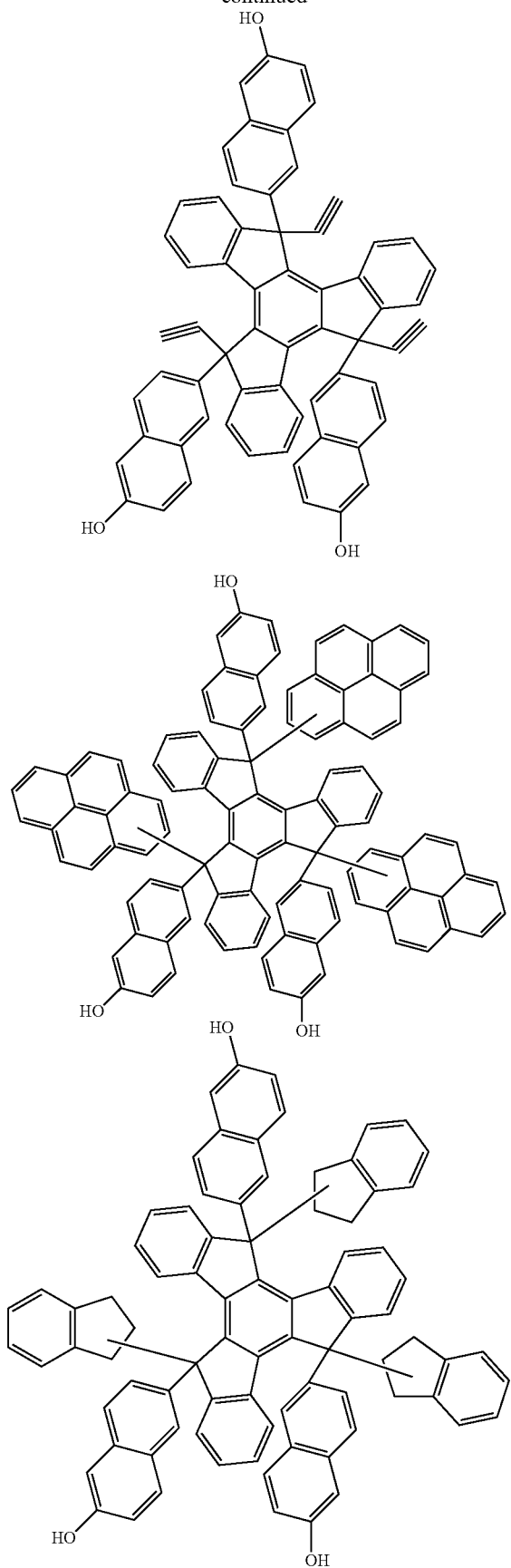
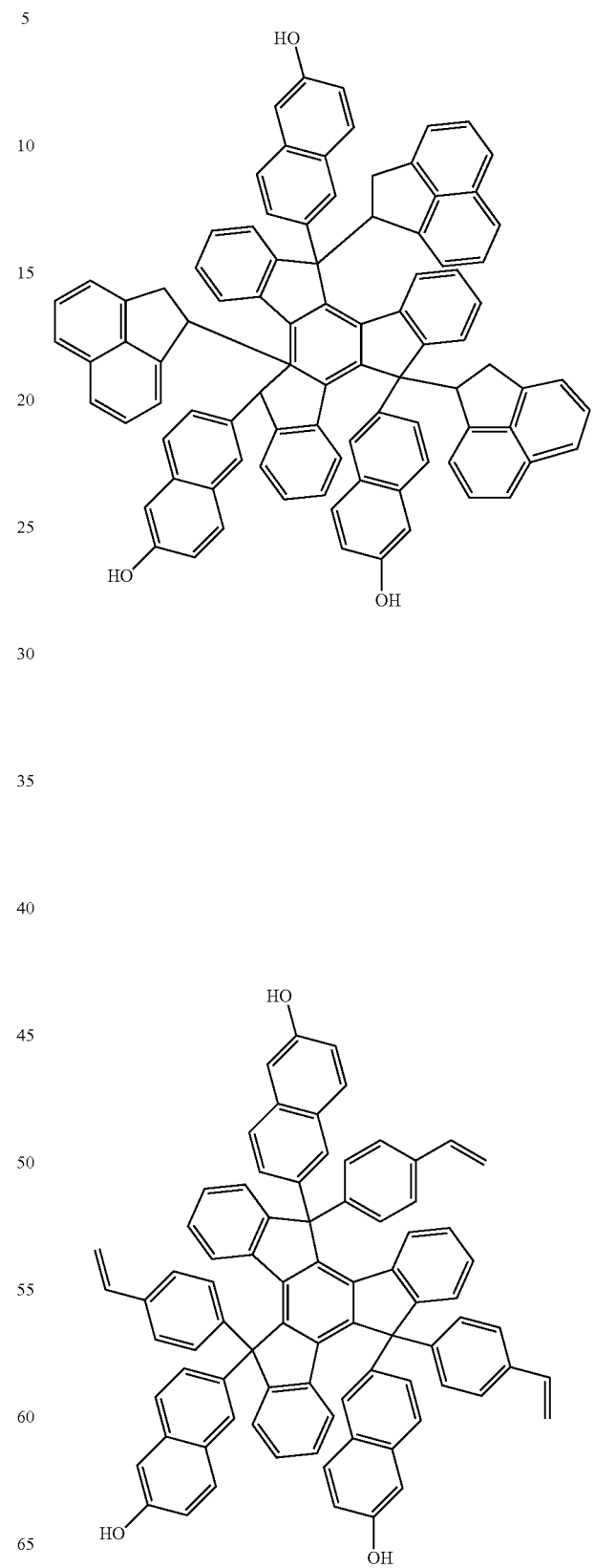

21
-continued
22
-continued
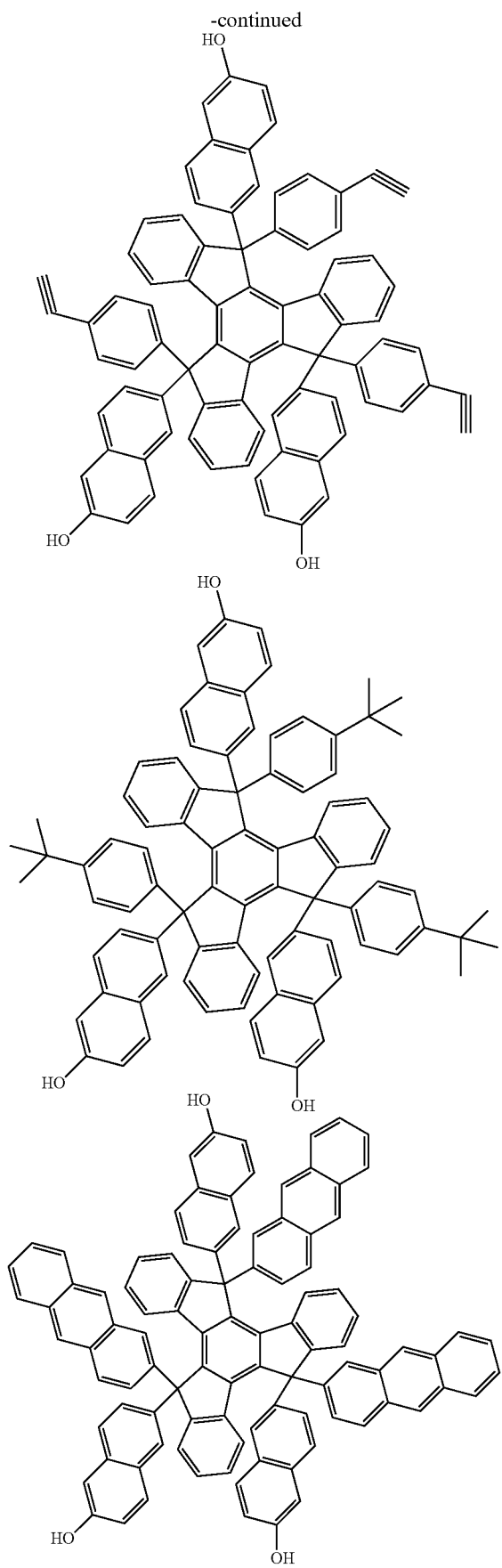
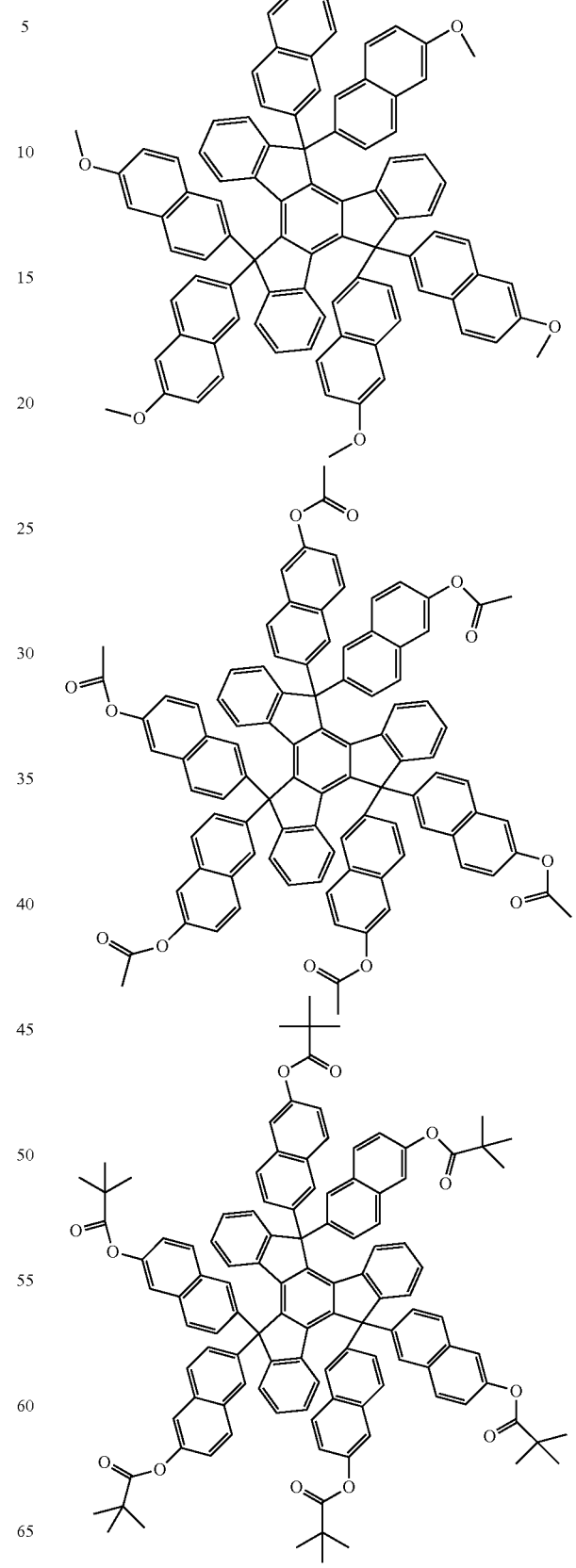

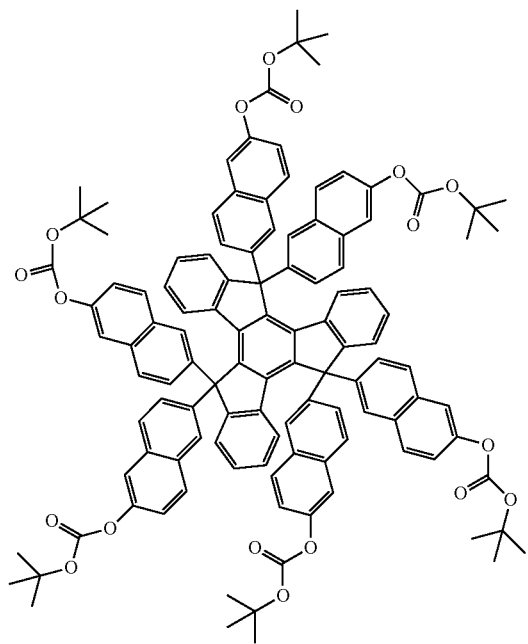
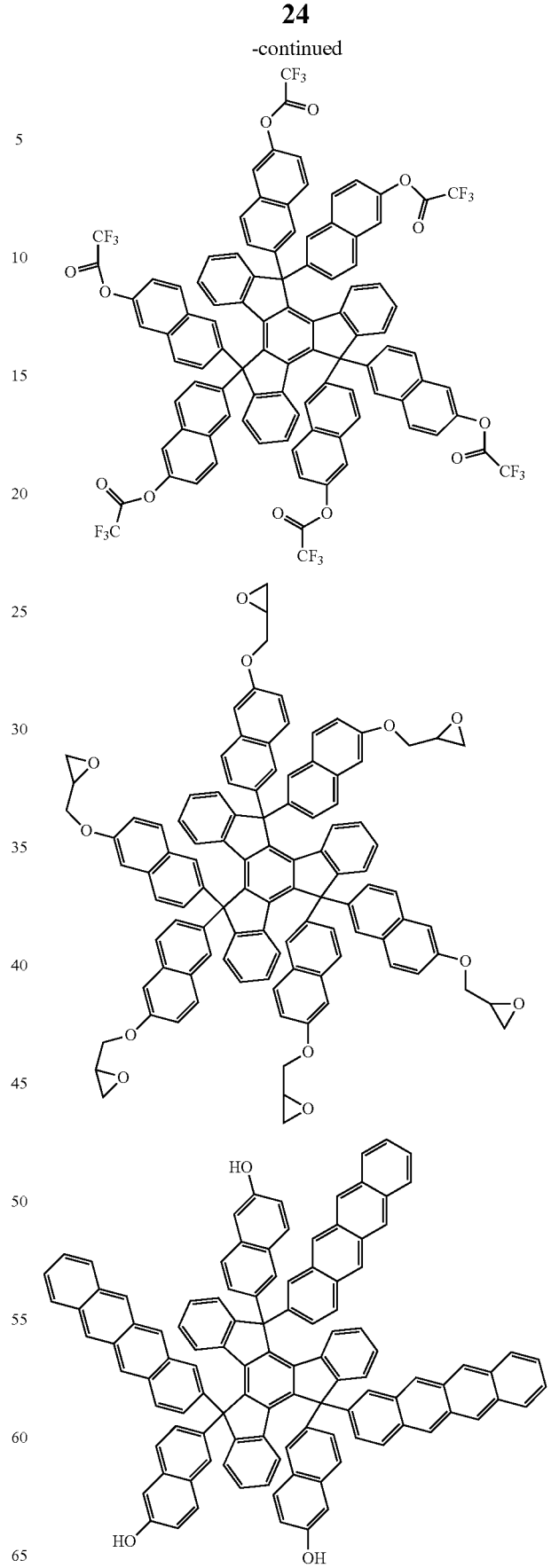

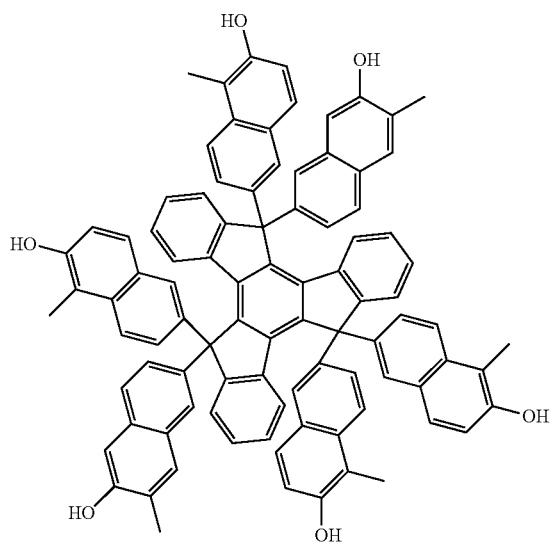

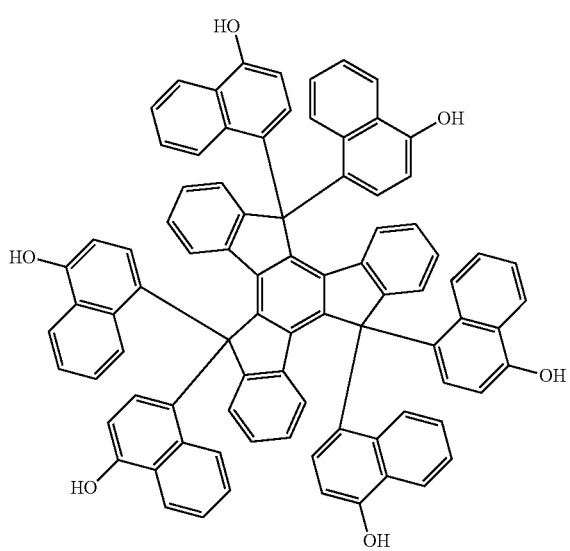

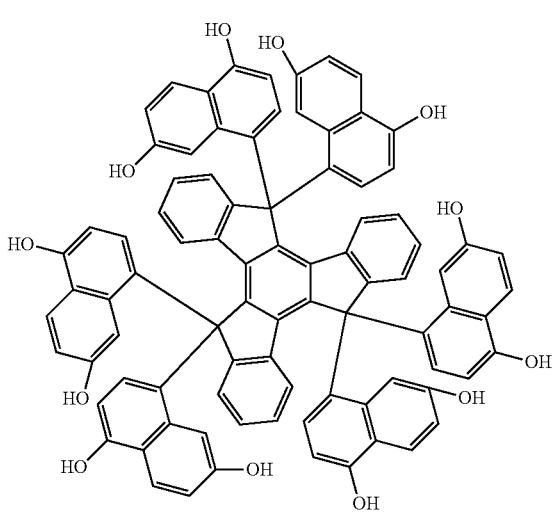

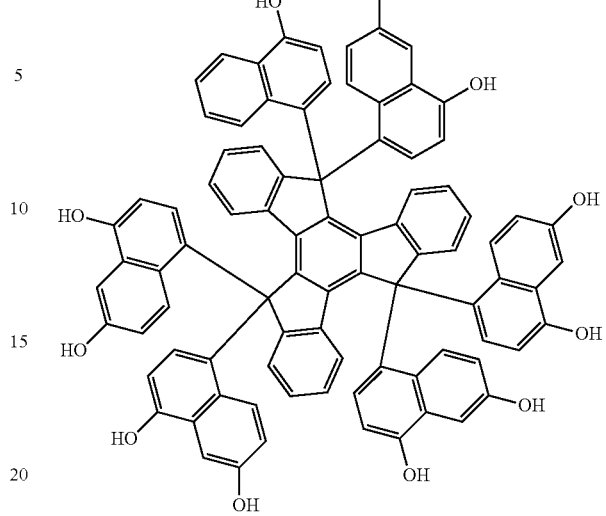

The truxene compound having a substituted or an unsubstituted naphthol group as shown by the general formula (1) has hydroxyl groups facing toward outside the molecule; and thus, reactivity of a crosslinking reaction with a neighboring molecule is so high that a hard film can be formed after thermal cure thereby generating less amount of an outgoing gas during baking. In addition, the hard film has a merit of not readily twisting during etching. Further, this truxene compound has high solubility in a solvent, whereby having a merit of an excellent fill-up property because it is not a polymer. On the other hand, a calixarene and a calixresorcin, whose hydroxyl groups are facing toward inside the molecule, have poor crosslinking property and solubility; and thus, they are difficult to be used as the resist underlayer film.

The truxene compound having a substituted or an unsubstituted naphthol group as shown by the general formula (1) has a quaternary carbon atom and contains carbon atoms with content thereof being nearly as high as 90% so that it has a high etching resistance. When an inorganic hard mask intermediate film selected from any of a silicon oxide film, a silicon nitride film, and a silicon oxynitride film is formed by a CVD method or an ALD method on the resist underlayer film, generally high temperature, especially 300° C. or higher in the case of a silicon nitride film, is needed so that high heat resistance is required also in the resist underlayer film. In addition, in the naphthol group-containing truxene compound, absorption thereof at 193 nm is comparatively small because of absorption shift due to a condensed hydrocarbon of benzene rings; and thus, a good antireflective effect can be expected in the trilayer process especially with the film thickness of 100 nm or more. Further, the naphthol group-containing truxene compound has a higher etching resistance in etching by $CF_4/CHF_3$ gas system and $Cl_2/BCl_3$ gas system used for substrate processing than a usual m-cresol novolak resin; and in addition, etching resistance thereof is enhanced by decrease of hydrogen atoms in proportion to increase of the aromatic number so that especially twisting of a pattern during etching can be suppressed. In addition, by baking thereof at the temperature of 300° C. or higher, further higher etching resistance and solvent resistance can be obtained, and pattern twisting during substrate etching can be suppressed.

A method for synthesizing a bisnaphthol group-containing compound by reacting a carbonyl group-containing compound with a naphthol is shown in the Japanese Patent Laid- Open Publication No. 2007-99741. In this reference, a method for synthesizing a fluorene bisnaphthol by reacting a fluorenone with a naphthol in the presence of an acid catalyst is shown. A similar method to this can be used in the reaction between a truxenone and a naphthol.

Illustrative example of the naphthols in this case include 1-naphthol, 2-naphthol, 2-methyl-1-naphthol, 4-methoxy-1-naphthol, and 7-methoxy-2-naphthol; a dihydroxynaphthalene such as 1,5-dihydroxynaphthalene, 1,7-dihydroxynaphthalene, 2,6-dihydroxynaphthalene, and 2,7-dihydroxynaphthalene; and a trihydroxynaphthalene such as 1,2,4-trihydroxynaphthalene and 1,3,8-trihydroxynaphthalene. These naphthols may be used singly or in a combination of two or more of them.

The resist underlayer film composition of the present invention may contain further a novolak resin obtained by a condensation reaction between the naphthol-containing truxene compound as shown by the general formula (1) and an aldehyde.

Illustrative example of the aldehyde used therein includes formaldehyde, trioxane, paraformaldehyde, benzaldehyde, acetaldehyde, propyl aldehyde, phenyl acetaldehyde, α-phenylpropyl aldehyde, β-phenylpropyl aldehyde, o-hydroxy benzaldehyde, m-hydroxy benzaldehyde, p-hydroxy benzaldehyde, o-chloro benzaldehyde, m-chloro benzaldehyde, p-chloro benzaldehyde, o-nitro benzaldehyde, m-nitro benzaldehyde, p-nitro benzaldehyde, o-methyl benzaldehyde, m-methyl benzaldehyde, p-methyl benzaldehyde, p-ethyl benzaldehyde, p-n-butyl benzaldehyde, 1-naphthalaldehyde, 2-naphthalaldehyde, and furfural. Among them, especially formaldehyde may be used suitably.

These aldehydes may be used singly or in a combination of two or more of them. Amount of these aldehydes to be used is preferably 0.2 to 5 moles, or more preferably 0.5 to 2 moles, relative to 1 mole of the naphthol group-containing truxene compound.

In the condensation reaction between a naphthol group-containing truxene compound and an aldehyde, a catalyst may be used. Specific example of the catalyst includes an acid catalyst such as hydrochloric acid, nitric acid, sulfuric acid, formic acid, oxalic acid, acetic acid, methanesulfonic acid, camphorsulfonic acid, tosyl acid, and trifluoromethanesulfonic acid.

Amount of these acid catalysts to be used is $1\times10^{-5}$ to $5\times10^{-1}$ mole relative to 1 mole of the bisnaphthol compound. In the case of copolymerization with a compound having a non-conjugated double bond such as indene, hydroxyindene, benzofurane, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, and limonene, an aldehyde is not essential.

In the polycondensation, water, methanol, ethanol, propanol, butanol, tetrahydrofurane, dioxane, or a mixture of them can be used as a reaction solvent thereof.

Amount of these solvents to be used is in the range of 0 to 2000 parts by mass relative to 100 parts by mass of reaction raw materials. Although reaction temperature thereof can be selected appropriately depending on reactivity of raw materials used therein, usually the temperature thereof is in the range of 10 to 200° C.

As to the polycondensation reaction method, there are a method wherein a naphthol group-containing truxene compound, an aldehyde, and a catalyst are charged all at once, and a method wherein an aldehyde is added gradually to a naphthol group-containing truxene compound in the presence of a catalyst.

After the polycondensation reaction, to remove unreacted raw materials, a catalyst, and so on that are present in the system, volatile substances can be removed by raising the temperature of a reactor to 130 to 230° C. with evacuating the system to about 1 to about 50 mmHg.

Meanwhile, although the naphthol group-containing truxene compound shown by the general formula (1) may be polymerized solely, it may be copolymerized with other phenols.

Illustrative example of copolymerizable phenols like this includes phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphthyl phenol, 3-naphthyl phenol, 4-naphthyl phenol, 4-trityl phenol, resorcinol, 2-methyl resorcinol, 4-methyl resorcinol, 5-methyl resorcinol, catechol, 4-t-butyl catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, and isothymol.

In addition, other copolymerizable monomer may be copolymerized. Specific example thereof includes 1-naphthol, 2-naphthol, 2-methyl-1-naphthol, 4-methoxy-1-naphthol, and 7-methoxy-2-naphthol; a dihydroxynaphthalene such as 1,5-dihydroxynaphthalene, 1,7-dihydroxynaphthalene, and 2,6-dihydroxynaphthalene; methyl 3-hydroxy-naphthalene-2-carboxylate, 4-trityl phenol, indene, hydroxyl indene, benzofurane, hydroxyanthracene, dihydroxyanthracene trihydroxyanthracene, hydroxypyrene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, fluorene bisphenol, and fluorene bisnaphthol. Terpolymer or a higher copolymer with these monomers may also be used.

Although molecular weight of the novolak resin synthesized as mentioned above in terms of polystyrene equivalent is not particularly restricted, weight-average molecular weight (Mw) thereof is preferably 1000 to 30000, in particular 2000 to 20000. Although molecular weight distribution (Mw/Mn) thereof is preferably in the range of 1.2 to 7, narrower molecular weight distribution, obtained by cutting a monomer component, an oligomer component, or a low molecular weight component having molecular weight (Mw) of 1000 or less, has higher crosslinking efficiency, and in addition, can suppress volatile components during baking so that pollution around a baking cup may be avoided.

The resist underlayer film composition of the present invention can contain further a naphthol group-containing truxene compound or a novolak resin thereof having a condensed aromatic substituent or an alicyclic substituent introduced to the ortho position of a hydroxyl group thereof. Here, specific example of the introducible substituent includes those as shown below.

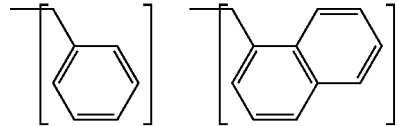

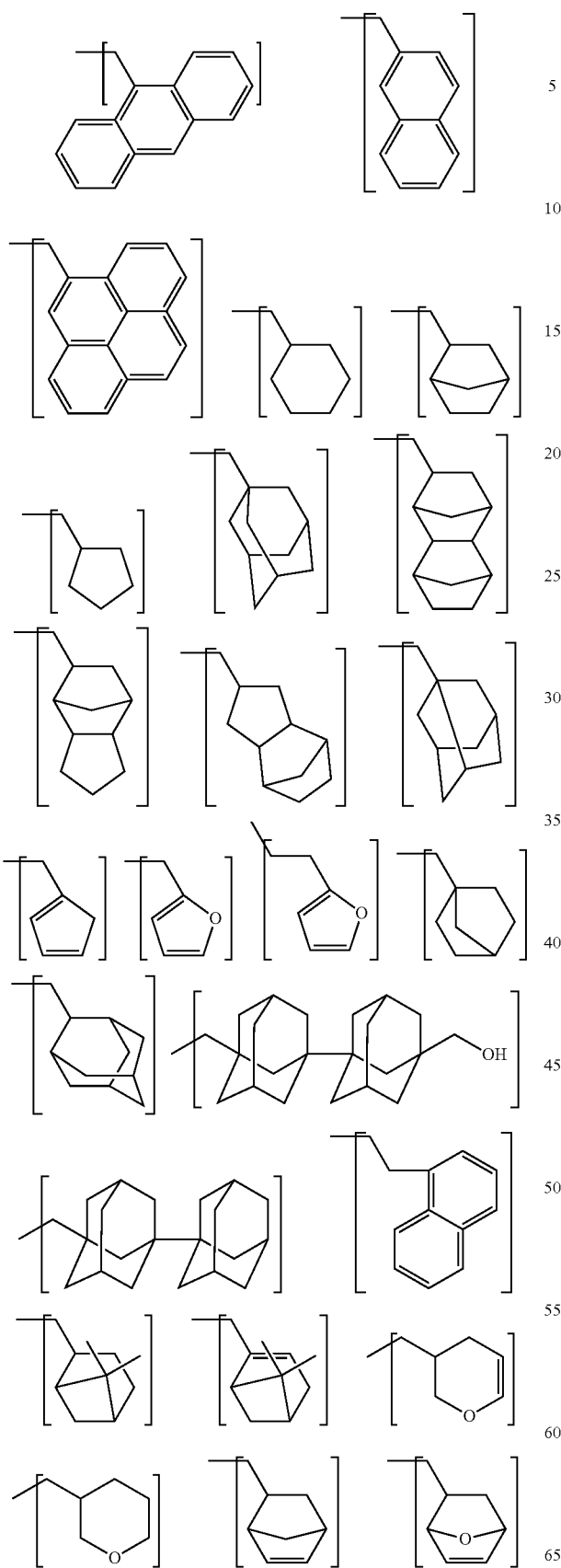
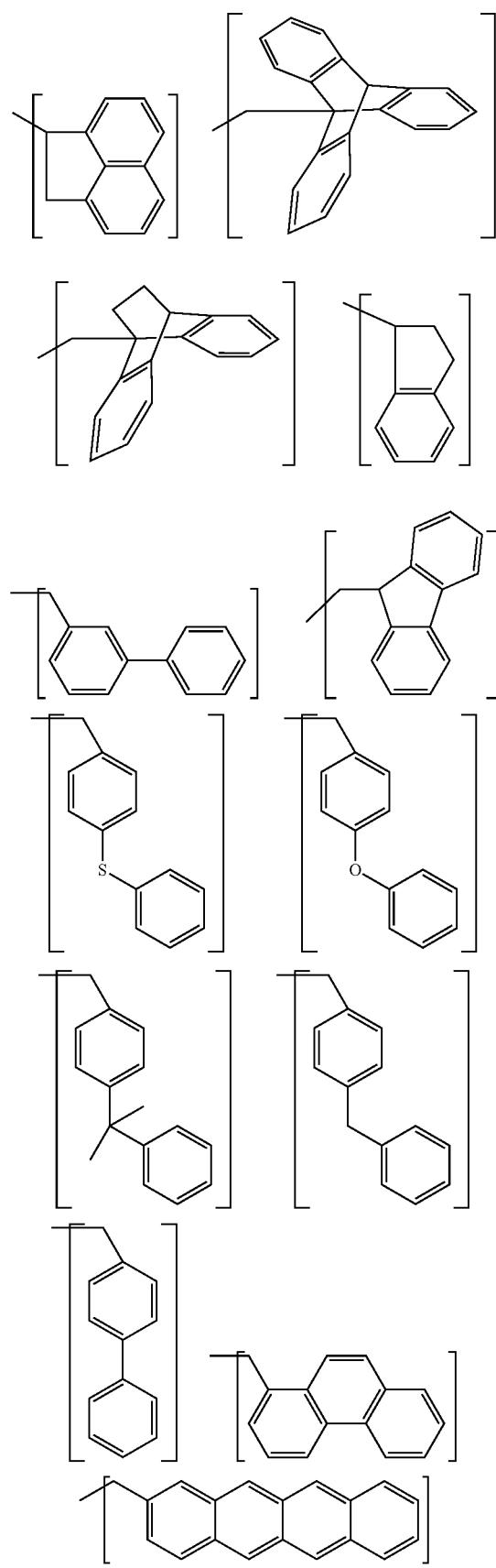

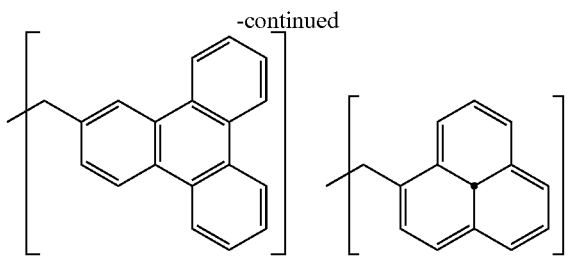

Among them, for example, a polycyclic aromatic group such as, for example, an anthracene methyl group and a pyrene methyl group is most preferably used for photo-exposure to a 248 nm beam. To improve transparency for photo-exposure to a 193 nm beam, a compound having an alicyclic structure or a naphthalene structure is preferably used. On the other hand, for photo-exposure to a 157 nm beam, a benzene ring has a window to improve transparency; and thus, absorption thereof needs to be increased by shifting the absorption wavelength. A furan ring has absorption shifted toward a shorter wavelength as compared with a benzene ring, whereby leading to slight increase in absorption of the 157 nm exposure light, but the effect thereof is small. A naphthalene ring, an anthracene ring, and a pyrene ring have absorption increased due to shift of the absorption wavelength toward a longer wavelength side, and these aromatic rings have an effect to improve etching resistance; and thus, these are preferably used.

As to the introducing method of the foregoing substituents, a method wherein into a naphthol group-containing truxene compound or a polymer after polymerization is introduced an alcohol, having the forgoing substituent bonded at the hydroxyl group, to the ortho-position or the para-position of the naphthol hydroxyl group in the presence of an acid catalyst may be mentioned. Illustrative example of the usable acid catalyst therein includes hydrochloric acid, nitric acid, sulfuric acid, formic acid, oxalic acid, acetic acid, methanesulfonic acid, n-butanesuflonic acid, camphorsulfonic acid, tosyl acid, and trifluoromethanesulfonic acid. Amount of these acid catalysts to be used is $1 \times 10^{-5}$ to $5 \times 10^{-1}$ mole relative to 1 mole of a phenol compound. Amount of the substituent to be introduced is 0 to 0.8 mole relative to 1 mole of hydroxyl group of the naphthol.

To improve transparency at 193 nm of the naphthol group-containing truxene compound shown by the general formula (1) used in the present invention, hydrogenation thereof may be carried out. Preferable hydrogenation rate thereof is 80% or less by mole or in particular 60% or less by mole relative to the aromatic group contained therein.

Further, the resist underlayer film of the present invention may be blended with other polymer and compound. As to the compound for blending or the polymer for blending, when mixed with the compound shown by the general formula (1), those having a role of improving a coating property by spin coating and a fill-up property of a non-planar substrate are preferable. In addition, a material having high carbon density and etching resistance is selected as the compound for blending or the polymer for blending.

Materials mentioned above are followings and copolymers thereof: phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphthyl phenol, 3-naphthyl phenol, 4-naphthyl phenol, 4-trityl phenol, resorcinol, 2-methyl resorcinol, 4-methyl resorcinol, 5-methyl resorcinol, catechol, 4-t-butyl catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene) bisphenol, 2,2'diphenyl-4,4'-(9H-fluorene-9-ylidene) bisphenol, 2,2'dimethoxy-4,4'-(9H-fluorene-9-ylidene) bisphenol, 2,3,2',3'-tetrahydro-(1,1')-spiroindene-6,6'-diol, 3,3,3',3'-tetramethyl-2,3,2',3'-tetrahydro-(1,1')-spiroindene-6,6'-diol, 3,3,3',3',4,4'-hexamethyl-2,3,2',3'-tetrahydro-(1,1')-spiroindene-6,6'-diol, 2,3,2',3'-tetrahydro-(1,1')-spiroindene-5,5'-diol, 5,5'-dimethyl-3,3,3',3'-tetramethyl-2,3,2',3'-tetrahydro-(1,1')-spiroindene-6,6'-diol, 1-naphthol, 2-naphthol, 2-methyl-1-naphthol, 4-methoxy-1-naphthol, and 7-methoxy-2-naphthol; a dihydroxynaphthalene such as 1,5-dihydroxynaphthalene, 1,7-dihydroxynaphthalene, and 2,6-dihydroxynaphthalene; a novolak of methyl 3-hydroxynaphthalene-2-carboxylate, indene, hydroxyindene, benzofurane, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, and limonene; polyhydroxy styrene, polystyrene, polyvinyl naphthalene, polyvinyl anthracene, polyvinyl carbazole, polyindene, polyacenaphthylene, polynorbornene, polycyclodecene, polytetracyclodecene, polynortricyclene, and poly(meth)acrylate.

In addition, the resist underlayer film composition of the present invention may be blended with a nortricyclene copolymer described in the Japanese Patent Laid-Open Publication No, 2004-205658, a hydrogenated naphthol novolak resin described in the Japanese Patent Laid-Open Publication No. 2004-205676, a naphthol dicyclopentadiene copolymer described in the Japanese Patent Laid-Open Publication No. 2004-205685, a phenol dicyclopentadiene copolymer described in the Japanese Patent Laid-Open Publication Nos. 2004-354554 and 2005-10431, a fluorene bisphenol novolak described in the Japanese Patent Laid-Open Publication No. 2005-128509, an acenaphthylene copolymer described in the Japanese Patent Laid-Open Publication No. 2005-250434, an indene copolymer described in the Japanese Patent Laid-Open Publication No. 2006-53543, a phenolic group containing fullerene described in the Japanese Patent Laid-Open Publication No. 2006-227391, a bisphenol compound and a novolak resin thereof described in the Japanese Patent Laid-Open Publication Nos. 2006-259249, 2006-293298, and 2007-316282, a dibisphenol compound and a novolak resin thereof described in the Japanese Patent Laid-Open Publication No. 2006-259482, an adamantane phenol novolak resin described in the Japanese Patent Laid-Open Publication No. 2006-285095, a hydroxyvinyl naphthalene copolymer described in the Japanese Patent Laid-Open Publication No. 2007-171895, a bisnaphthol compound and a novolak resin thereof described in the Japanese Patent Laid-Open Publication No. 2007-199653, a ROMP described in the Japanese Patent Laid-Open Publication No. 2008-26600, a resin compound shown in a tricyclopentadiene copolymer described in the Japanese Patent Laid-Open Publication No. 2008-96684, and a fullerene resin compound described in the Japanese Patent Laid-Open Publication Nos. 2006-227391 and 2008-158002.

Amount of the compound for blending or the polymer for blending is 0 to 1000 parts by mass, or preferably 0 to 500 parts by mass, relative to 100 parts by mass of the naphthol group-containing truxene compound shown by the general formula (1).

Performance which is required for the resist underlayer film having an antireflective function is not to cause intermixing between the resist upper layer film and the silicon-containing resist intermediate film formed on the resist underlayer film and not to cause diffusion of a low-molecular weight component to the resist upper layer film and to the resist intermediate film (Proc. SPIE Vol. 2195, p 225-229 (1994)). To avoid these, a method wherein after the resist underlayer film having an antireflective function is spin-coated, this is thermally crosslinked by baking is generally used. Accordingly, in the case that a crosslinking agent is added as the ingredient of the resist underlayer film composition having an antireflective function, there is a case that a method wherein a crosslinkable substituent is introduced to a compound or to a polymer which are contained in the resist underlayer film composition is used. Even in the case that a crosslinking agent like this is not particularly added therein, the naphthol group-containing truxene compound contained in the resist underlayer film composition of the present invention can be crosslinked by heating at the temperature of 300° C. or higher in accordance with the reaction mechanism shown later.

The naphthol group-containing truxene compound contained in the resist underlayer film composition of the present invention has a very high heat resistance; and thus, thermal decomposition thereof hardly occurs even if it is baked at high temperature of 300° C. or higher. Inventors of the present invention found that, in addition to the above, evaporation of a solvent and so on contained in this compound or a novolak resin thereof was accelerated by high temperature baking above 300° C. so that higher carbon density and compactness of the film could be obtained thereby improving etching resistance. It was also found that the baking above 300° C. brought in high solvent resistance so that twisting during substrate etching could be avoided. Generally, baking of a composition having a low heat resistance at high temperature of above 300° C. causes thermal decomposition; and thus, this does not necessarily lead to high carbon density, but sometimes rather leads to deterioration.

Illustrative example of the crosslinking agent usable in the resist underlayer film composition of the present invention includes a melamine compound substituted with at least one substituent selected from the group consisting of a methylol group, an alkoxymethyl group, and an acyloxymethyl group; a guanamine compound; a glycoluril compound or a glycolurea compound; an epoxy compound; a thioepoxy compound; an isocyanate compound; an azide compound; and a compound having a double bond such as an alkenyl ether group. Materials described in the paragraphs of [0055] to [0060] in the Japanese Patent Laid-Open Publication No. 2007-199653 may be added as the crosslinking agent as mentioned above.

To the resist underlayer film composition of the present invention may be added an acid generator to accelerate a thermal crosslinking reaction further. As to the acid generator, there are different types in accordance with a way to generate an acid, by thermal decomposition or by photo-exposure; and any of them may be added thereinto. Specific example thereof includes an onium salt, a diazomethane derivative, a glyoxime derivative, a bissulfone derivative, a sulfonate ester of an N-hydroxyimide compound, a β-ketosulfonic acid derivative, a disulfone derivative, a nitrobenzyl sulfonate derivative, and a sulfonate ester derivative. Materials described in the paragraphs of [0061] to [0085] in the Japanese Patent Laid-Open Publication No. 2007-199653 may be added as the acid generator as mentioned above.

In addition, to the resist underlayer film composition of the present invention may be blended a basic compound to improve storage stability thereof. The basic compound plays a role as a quencher of an acid to suppress a crosslinking reaction caused by minute amount of the acid generated from the acid generator. Specifically, materials described in the paragraphs of [0086] to [0090] in the Japanese Patent Laid-Open Publication No. 2007-199653 may be added as the basic compound as mentioned above.

As to the organic solvent usable in the resist underlayer film composition of the present invention, there is no particular restriction as far as the truxene compound shown by the general formula (1), the foregoing polymer, acid generator, crosslinking agent, and other additives can be dissolved thereinto. Specifically, a ketone, an alcohol, an ether, and an ester may be mentioned; and these may be used singly or as a mixture of two or more of them, tough not limited to them. Solvents described in the paragraphs of [0091] to [0092] in the Japanese Patent Laid-Open Publication No. 2007-199653 may be added as the organic solvent as mentioned above.

To the resist underlayer film composition of the present invention may be added a surfactant to improve a coating property in spin coating. Surfactants described in the paragraphs of [0165] to [0166] in the Japanese Patent Laid-Open Publication No. 2008-111103 may be used.

In the patterning process of the present invention, similarly to the photoresist case, the resist underlayer film composition mentioned above can be applied on a substrate to be processed by a spin coating method and the like. By using a spin coating method and the like, an excellent fill-up property can be obtained. After spin coating, a solvent is evaporated and then baking is carried out to accelerate a crosslinking reaction to avoid mixing between the resist intermediate film and the resist upper layer film and so on.

Baking after spin coating is carried out at the temperature of 150 to 600° C. with the time of 10 to 600 seconds, or preferably 10 to 300 seconds. To increase the crosslinking density, higher baking temperature is desirable; and thus, the temperature thereof is preferably 200° C. or higher, or more preferably 300° C. or higher. By high temperature baking at 300° C. or higher, not only a crosslinking reaction by a dehydration reaction and a dehydrogenation reaction takes place but also hydrogen content in the film is decreased by oxidation so that pattern twisting during etching by a fluorocarbon gas does not take place readily. Baking temperature is more preferably in the range of 350 to 500° C. In view of effects on device damage and wafer deformation, upper temperature limit during heating in a lithography wafer process is 600° C. or lower, or preferably 500° C. or lower.

As described in the previously shown SPIE Vol. 469, p 72 (1984), a novolak resin generates a phenoxy radical by heating, whereby activating a methylene group of a novolak bond to effect crosslinking by bonding of the methylene groups by themselves. Because this reaction is a radical reaction not releasing a molecule, film shrinkage by crosslinking does not take place if the material has a high heat resistance. Accordingly, film shrinkage can be suppressed further if the foregoing novolak resin which contains the truxene compound shown by the general formula (1) is contained in the resist underlayer film composition.

In addition, an oxidative coupling with which two 2-naphthol molecules are bonded at their 1-positions has been known. Usually the reaction takes place in a homogeneous catalyst system of a transition metal of $V^{4+}$ (2), $Fe^{3+}$ (3), or $Cu^{2+}$ (4); but the coupling reaction also takes place in the presence of an oxygen even at high temperature of 300° C. or higher. In the naphthol group-containing truxene compound of the present invention too, the crosslinking takes place three-dimensionally by the oxidative coupling.

In order to effect this oxidative coupling during baking, it is preferable to carry out the baking in an air; but an oxygen penetrates to inside the film to cause the oxidation reaction so that there is a risk of accelerating the etching rate. To avoid this, baking is carried out by charging an inert gas such as $N_2$, Ar, and He so that oxidation of the resist underlayer film can be prevented. In order to prevent oxidation, oxygen concentration therein needs to be controlled in the level of preferably 1000 ppm or less, or more preferably 100 ppm or less.

Meanwhile, thickness of this resist underlayer film is selected appropriately, but preferably in the range of 30 to 20000 nm, in particular 50 to 15000 nm. After formation of the resist underlayer film, on it a silicon-containing resist intermediate film and a silicon-uncontaining resist upper layer film may be formed in the case of the trilayer process.

According to the patterning process of the present invention, for example, a resist under layer film is formed on a substrate by coating the resist underlayer film composition containing the naphthol group-containing truxene compound shown by the general formula (1), on the said resist underlayer film is formed a resist upper layer film of a photoresist composition via a resist intermediate film, an intended area of this resist upper layer film is exposed to a radiation beam and so forth, development with a developer solution is carried out to form a resist pattern, the resist intermediate film is etched by using this obtained resist pattern as a mask, and then the resist underlayer film and the substrate are processed by using the resist intermediate film pattern as a mask.

In the case of forming an inorganic hard mask intermediate film on the resist underlayer film, a silicon oxide film, a silicon nitride film, or a silicon oxynitride film (SiON film) is formed by such method as a CVD method and an ALD method. A method for forming the silicon nitride film is described in the Japanese Patent Laid-Open Publication No. 2002-334869 and International Patent Laid-Open Publication No. 2004/066377. Film thickness of the inorganic hard mask intermediate film is 5 to 200 nm, or preferably 10 to 100 nm; and among the films, a SiON film is most preferably used because of its high effect as the bottom antirefrective coating. Substrate temperature during the time of forming the SION film reaches in the range of 300 to 500° C., and thus, the resist underlayer film needs to withstand the temperature of 300 to 500° C. The resist underlayer film composition containing the naphthol group-containing truxene compound shown by the general formula (1) used in the present invention has a high heat resistance to withstand high temperature of 300 to 500° C.; and thus, a combination of the inorganic hard mask intermediate film formed by a CVD method or an ALD method with the resist underlayer film formed by a spin coating method is possible.

A photoresist film may be formed, as the resist upper layer film, on the resist intermediate film like this; but alternatively, after an organic bottom antirefrective coating (BARC) is formed on the resist intermediate film by spin coating, the photoresist film may be formed thereon. When the SiON film is used as the resist intermediate film, owing to two bottom antirefrective coatings of the SiON film and the BARC film, reflection can be suppressed even in an immersion exposure with high NA of more than 1.0. Another merit of forming the BARC film resides in the effect that footing profile of the photoresist pattern just above the SiON film can be suppressed.

As to the silicon-containing resist intermediate film of the trilayer process, an intermediate film based on polysilsesquioxane is also used preferably. Reflection can be suppressed by affording the resist intermediate film with the effect as the bottom antirefrective coating. Specifically, a composition containing a silicon-containing compound based on the silsesquioxanes shown in the Japanese Patent Laid-Open Publication Nos. 2004-310019, 2005-15779, 2005-18054, 2005-352104, 2007-65161, 2007-163846, 2007-226170, and 2007-226204 may be used.

Especially for exposure to a 193 nm beam, if the resist underlayer film formed of a composition containing many aromatic groups whereby having high substrate etching resistance is used, k-value and substrate reflection become high; but the substrate reflection can be suppressed to the level of 0.5% or lower by suppressing the reflection by the resist intermediate film.

As to the resist intermediate film having an antireflective effect, polysilsesquioxanes crosslinkable by an acid or heat having an anthracene group for exposure to the lights of 248 nm and 157 nm, and a phenyl group or a light-absorbing pendant group having a silicon-silicon bond for exposure to the light of 193 nm are preferably used.

Formation of the silicon-containing resist intermediate film by a spin coating method is simpler and has more merit in cost than by a CVD method.

The resist upper layer film in the trilayer process may be either a positive type or a negative type, and the same photoresist composition as those usually used can be used. When a monolayer resist upper layer film is formed by the above-mentioned photoresist composition, similarly to formation of the resist underlayer film, a spin coating method is preferably used. After spin coating of the photoresist composition, pre-baking is carried out, preferably at the temperature of 60 to 180° C. and the time for 10 to 300 seconds. Thereafter, according to usual manners, photo-exposure, post-exposure bake (PEB), and development are carried out to obtain a resist pattern. Meanwhile, thickness of the resist upper layer film is not particularly restricted; but preferable thickness thereof is 30 to 500 nm, especially 50 to 400 nm.

As to the exposure light, a high energy beams with the wavelength thereof being 300 nm or less, specifically excimer laser beams of 248 m, 193 nm, and 157 nm, a soft X-ray of 3 to 20 nm, an electron beam, an X-ray, and so on may be mentioned.

Next, etching is carried out by using the resist pattern thus obtained as a mask. Etching of the resist intermediate film in the trilayer process, especially etching of the inorganic hard mask intermediate film is carried out with a chlorofluorocarbon gas by using the resist pattern as a mask. Then, the resist underlayer film is etch-processed with an oxygen gas or a hydrogen gas by using the resist intermediate film pattern, especially by using the inorganic hard mask pattern as a mask. Especially when the resist upper layer film is formed by using a resist upper layer film material of a photoresist composition not containing a silicon-containing polymer, it is preferable that the resist underlayer film be etched with an etching gas system mainly comprised of an oxygen gas or a hydrogen gas by using the patterned resist intermediate film or the patterned inorganic hard mask intermediate film as a mask. At the time when the resist underlayer film is etched by using the patterned inorganic hard mask intermediate film as a mask, the silicon-containing inorganic hard mask shows an etching resistance by an oxygen gas or a hydrogen gas.

Subsequent etching of the substrate to be processed can be done by a usual method; for example, a substrate of $SiO_2$, SiN, or a low dielectric insulator silica film is etched by a gas system comprising mainly a chlorofluorocarbon gas; and a substrate of p-Si, Al, or W is etched by a gas system comprising mainly a chlorine gas or a bromine gas. If the substrate is etched by a chlorofluorocarbon gas system, the silicon-containing resist intermediate film of the trilayer process is removed simultaneously with the substrate processing. If the substrate is etched by a chlorine gas system or a bromine gas system, removal of the silicon-containing intermediate film must be done separately by dry etching with a chlorofluorocarbon gas system after substrate processing.

The resist underlayer film formed by the patterning process of the present invention has excellent characteristics in etching resistance of these substrates to be processed.

Meanwhile, the substrate to be processed may have a film of a layer to be processed on the substrate. The substrate is not particularly restricted; a material different from those used in the layer to be processed, such as Si, α-Si, p-Si, $SiO_2$, SiN, SiON, W, TiN, and Al may be used. In the layer to be processed, a low-k film and its stopper film, such as Si, SiO$_2$, SiON, SiN, p-Si, α-Si, W, W—Si, Al, Cu, Al—Si may be used; and film thickness of usually 50 to 10000 nm, especially 100 to 5000 nm is formed.

Figure 2:
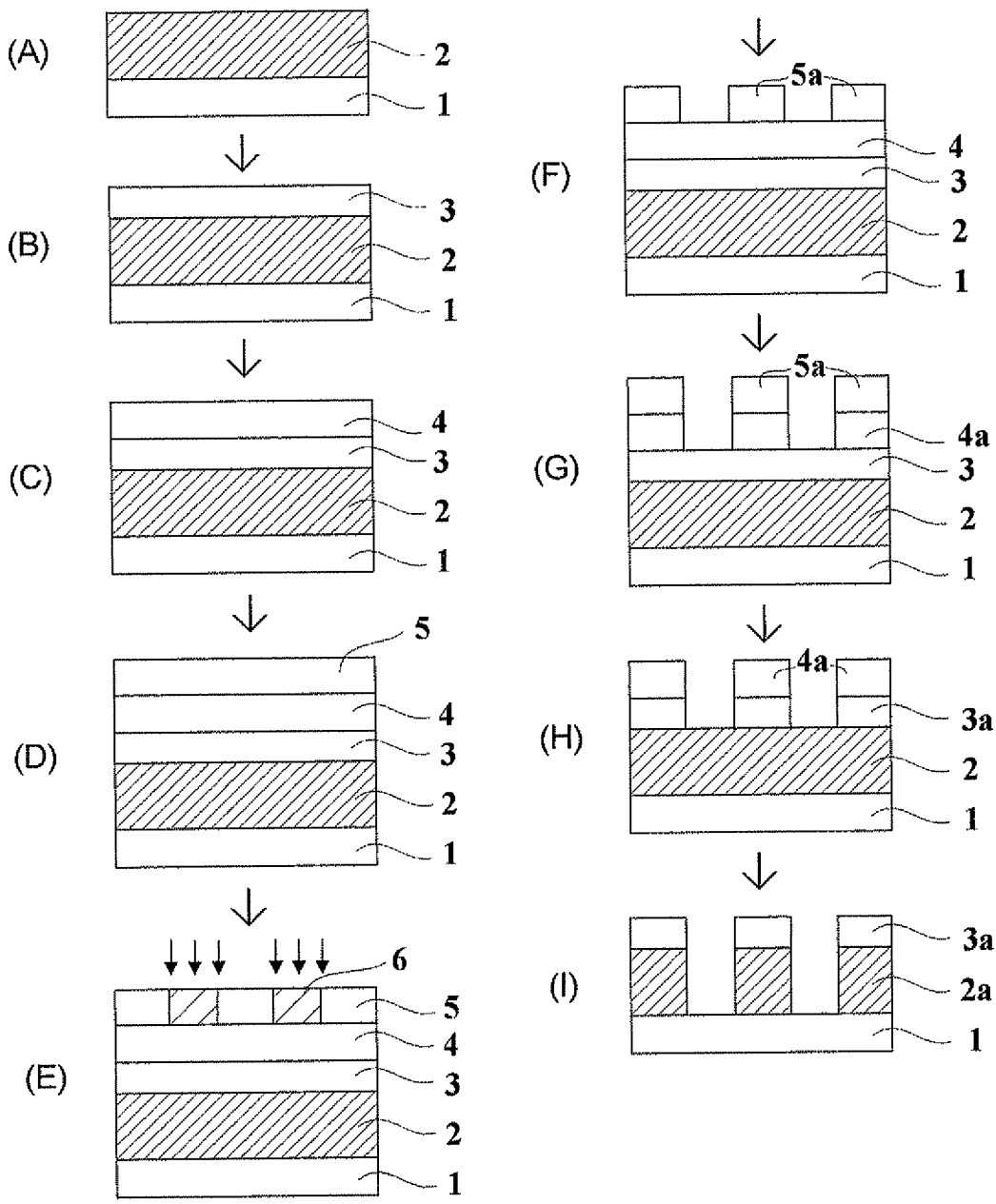
FIG. 2 is an explanatory view showing one embodiment of a patterning process (trilayer-resist process) according to the present invention.
Figure 3:
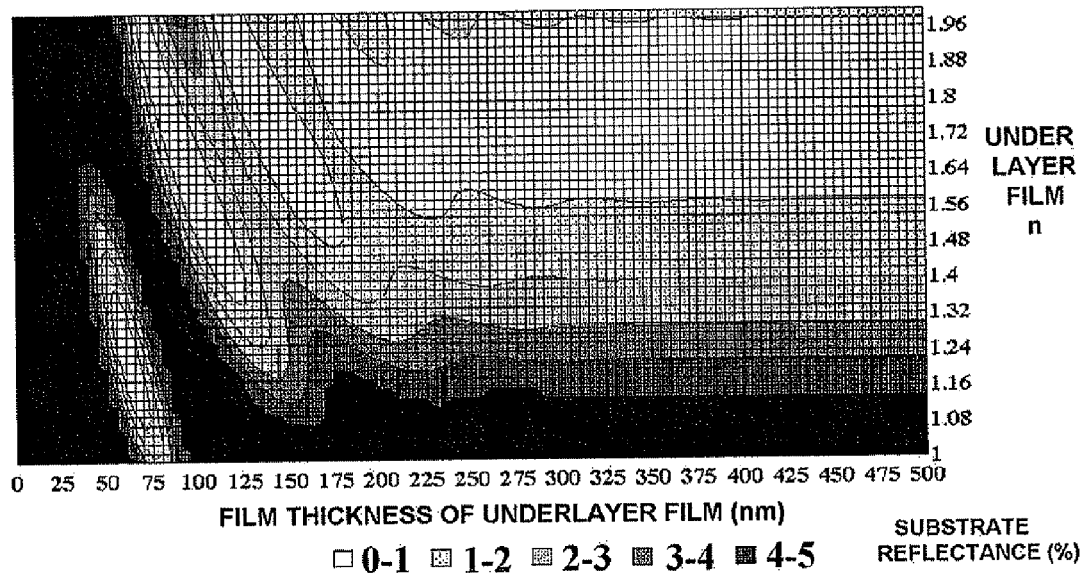
FIG. 3 is a graph showing reflectivity of a substrate in a bilayer-resist process where the refractive index k-value of the resist underlayer film is fixed at 0.3, the n-value of the resist underlayer film is changed in the range of 1.0 to 2.0, and the thickness of the resist underlayer film is changed in the range of 0 to 500 nm.
Figure 4:
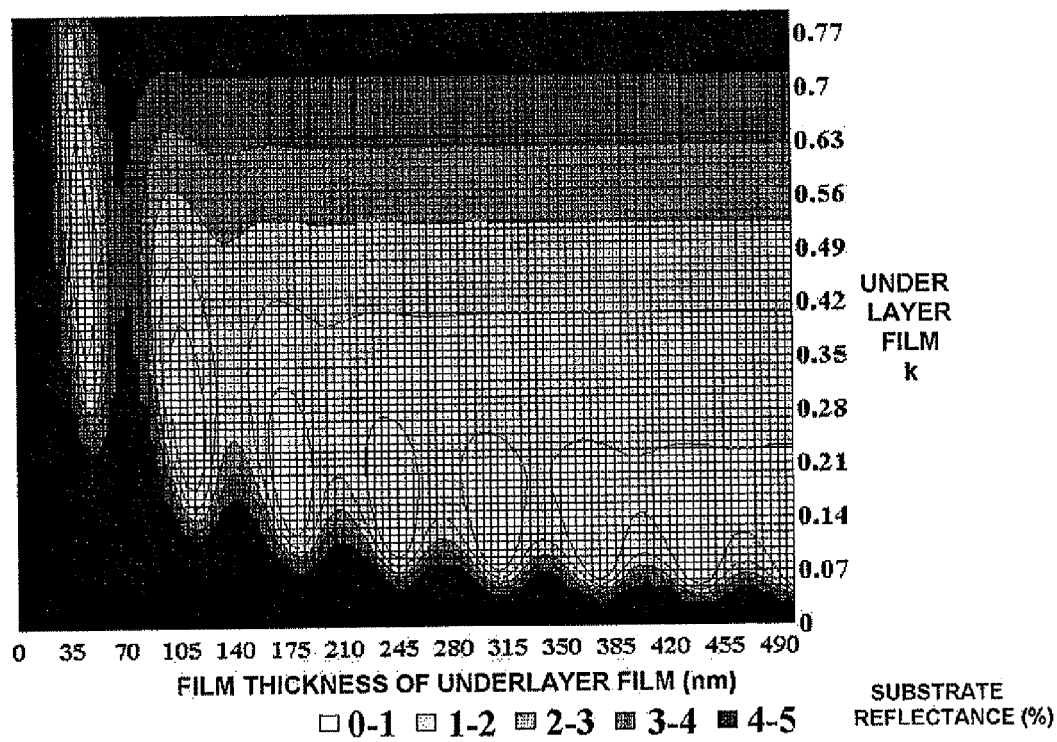
FIG. 4 is a graph showing reflectivity of a substrate in a bilayer-resist process where the resist refractive index n-value of the resist underlayer film is fixed at 1.5, the k-value of the resist underlayer film is changed in the range of 0 to 0.8, and the thickness of the resist underlayer film is changed in the range of 0 to 500 nm.
Figure 5:
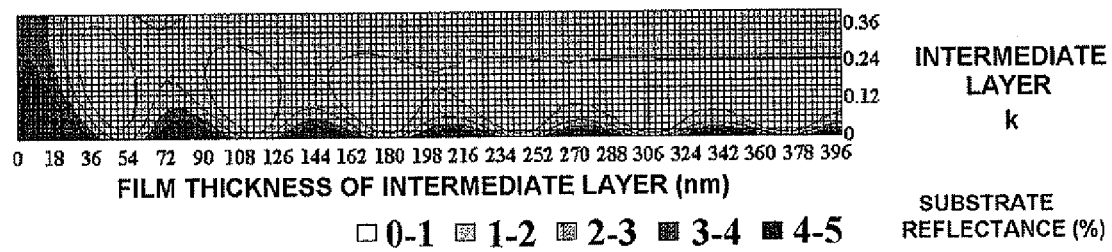
FIG. 5 is a graph showing fluctuations of reflectivity of a substrate in a trilayer-resist process where the refractive index n-value of an underlayer film is fixed at 1.5, the k-value of the underlayer film is fixed at 0.5, the thickness of the underlayer film is fixed at 500 nm, the refractive index n-value of an intermediate resist layer is fixed at 1.5, the k-value of the intermediate resist layer is changed in the range of 0 to 0.3, and the thickness of the intermediate resist layer is changed in the range of 0 to 400 nm.
Figure 6:
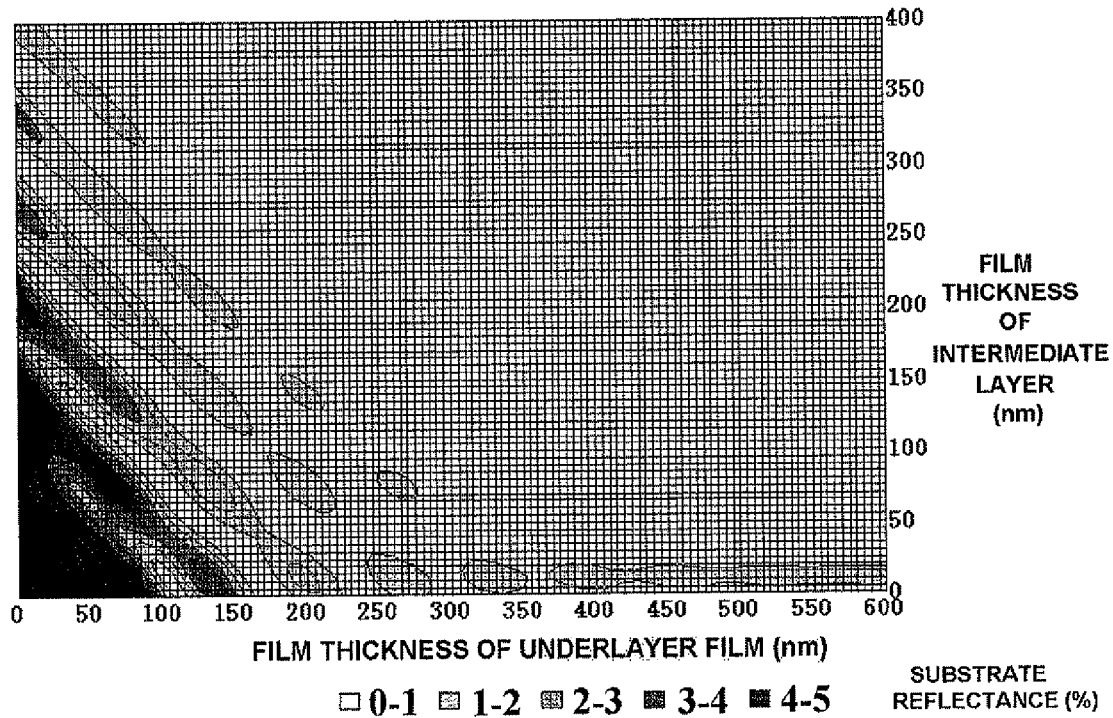
FIG. 6 is a graph showing fluctuations of reflectivity of a substrate in a trilayer-resist process where the refractive index n-value of the resist underlayer film is fixed at 1.5, the k-value of the resist underlayer film is fixed at 0.2, the refractive index n-value of the resist intermediate layer is fixed at 1.5, the k-value of the resist intermediate layer is fixed at 0.1, and the thicknesses of the resist underlayer film and the intermediate resist layer are changed respectively.
Figure 7:
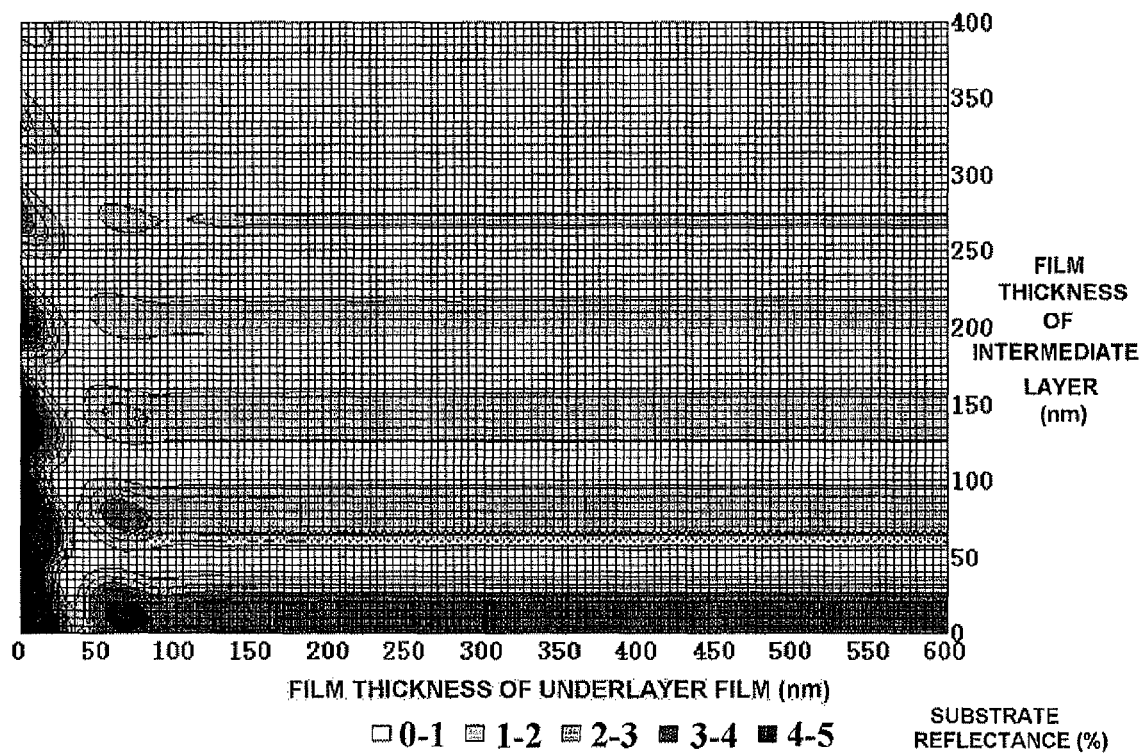
FIG. 7 is a graph showing fluctuations of reflectivity of a substrate in a trilayer-resist process where the refractive index n-value of the resist underlayer film is fixed at 1.5, the k-value of the resist underlayer film is fixed at 0.6, the refractive index n-value of the resist intermediate layer is fixed at 1.5, the k-value of the intermediate resist layer is fixed at 0.1, and the thicknesses of the resist underlayer film and the resist intermediate resist layer are changed respectively.

One example of the trilayer process will be specifically shown below with referring to FIG. 2.

In the case of the trilayer process, as shown in FIG. 2(A) to 2(D), after resist underlayer film 3 is formed on layer to be processed 2 formed on substrate 1 by using the resist underlayer film composition of the present invention, resist intermediate film 4 is formed, and resist upper layer film 5 is formed thereonto by using the photoresist composition.

Then, as shown in FIG. 2(E), prescribed area 6 of the resist upper layer film is exposed; and then PEB and development are carried out to form resist upper layer film pattern 5a (FIG. 2(F)). The resist intermediate film 4 is etch-processed with a CF gas system by using the resist upper layer film pattern 5a thus obtained as a mask to obtain resist intermediate film pattern 4a (FIG. 2(G)). After the resist upper layer film pattern 5a is removed, the resist underlayer film 3 is etched by an oxygen plasma by using the resist intermediate film pattern 4a thus obtained as a mask to obtain resist underlayer film pattern 3a (FIG. 2(H). After the resist intermediate film pattern 4a is removed, the layer to be processed 2 is etch-processed by using the resist underlayer film pattern 3a as a mask to form layer to be processed pattern 2a on the substrate (FIG. 2(I)).

In the case of forming the inorganic hard mask intermediate film, the resist intermediate film 4 is the inorganic hard mask intermediate film; in the case of forming the BARC film, the BARC film is formed between the resist intermediate film 4 and the resist upper layer film 5. Etching of the BARC film may be done continuously in advance of etching of the resist intermediate film 4, or etching of the resist intermediate film 4 may be carried out, by changing the equipment and so on, after etching of only the BRAC film is done.

Meanwhile, in the above explanation and Examples explained hereinafter, molecular weight is measured as the polystyrene equivalent value with a gel permeation chromatography (GPC); and from the weight-average molecular weight (Mw) and the number-average molecular weight (Mn), dispersibility (Mw/Mn) is obtained.

EXAMPLES

Hereinafter, the present invention will be explained specifically by showing Synthesis Examples, Comparative Synthesis Examples, Examples, and Comparative Examples; but the present invention is not restricted by these descriptions.

Synthesis Example 1

Naphthol Truxene 1

In a 1-liter flask, 80 g of truxenone, 144 g of 2-naphthol, 4 g of β-mercaptopropionic acid, and 500 g of toluene were mixed; and then, 10 g of 98% sulfuric acid was added gradually into the mixture. The reaction was carried out with stirring the resulting mixture at 50° C. for 10 hours. The obtained reaction solution was added with 100 g of toluene and 30 g of water, and then with a 10% aqueous tetramethyl ammonium hydroxide solution till pH 7; and then water-washing and separation were repeated for 5 times. After removal of water, Naphthol Truxene 1 was obtained. The structure thereof was identified with the $^1$H-NMR analysis.

Synthesis Example 2

Naphthol Truxene 2

This was synthesized by reacting truxenone with 2-methoxynaphthalene followed by deprotection of the methyl group.

Synthesis Example 3

Naphthol Truxene 3

The hydroxyl group of the methoxy truxene, the intermediate of Naphthol Truxene 2, was reduced to a hydrogen atom; and then, this was reacted with naphthalene magnesium chloride, and then deprotection of the methoxy group was carried out to synthesize this compound.

Synthesis Example 4

Naphthol Truxene 4

Naphthol Truxene 1 was reacted with di-tert-butyl dicarbonate to synthesize this compound.

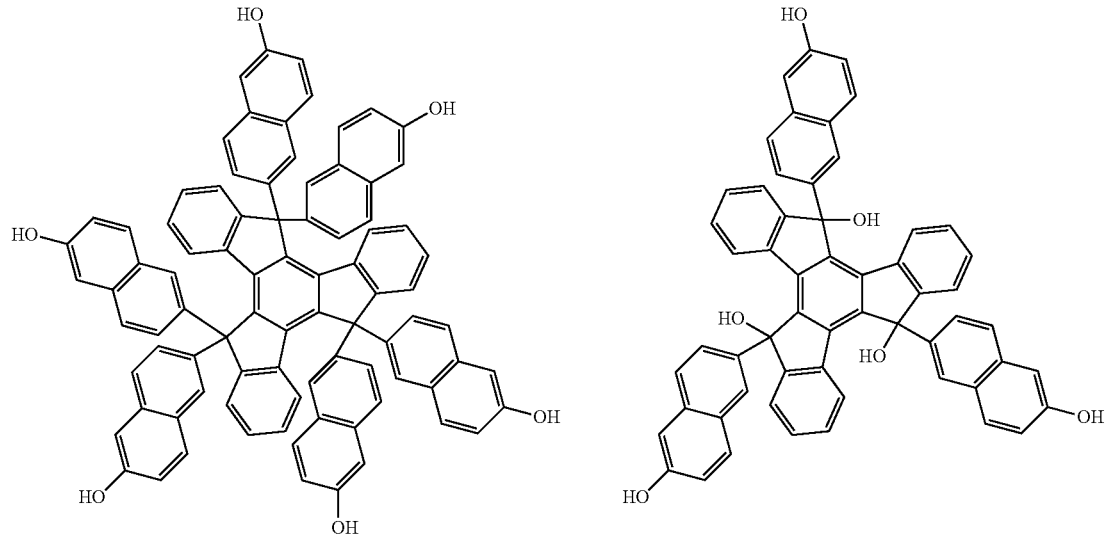

Naphthol Truxene 1    Naphthol Truxene 2

-continued

Naphthol Truxene 3

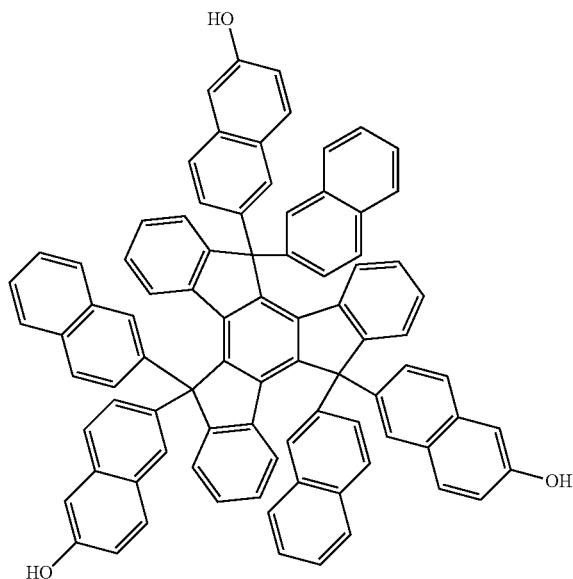

Naphthol Truxene 4

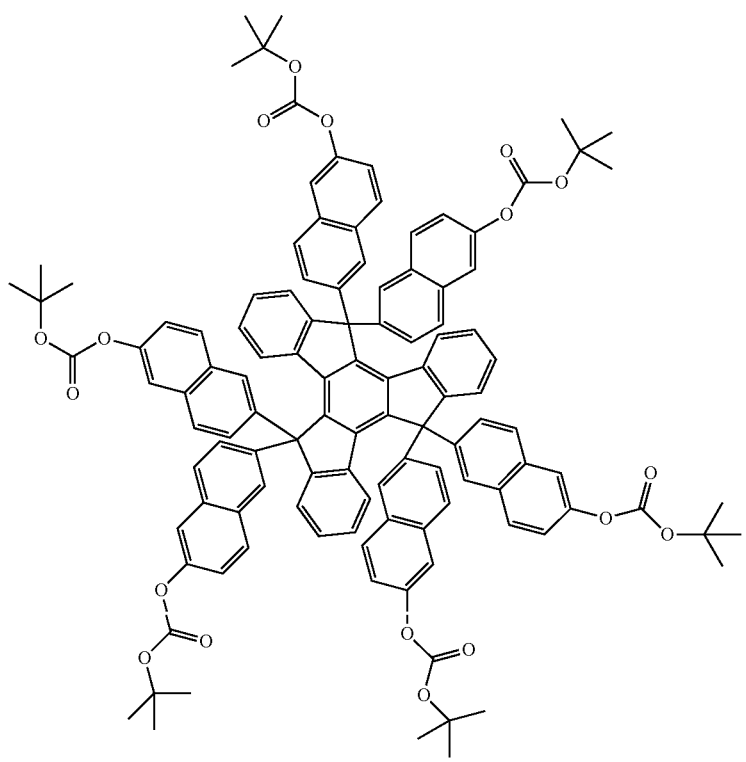

Synthesis Example 5

Truxene Novolak Polymer 1

In a 1-liter flask, 169 g of Naphthol Truxene 3, 75 g of 37% aqueous formalin, 5 g of oxalic acid, and 200 g of dioxane were mixed, and then, the resulting mixture was stirred at 100° C. for 24 hours. After the reaction, the reaction solution was dissolved into 500 mL of methyl isobutyl ketone; and then, the catalyst and metal impurities were removed with sufficient washing by water. After removal of the solvent under reduced pressure, water and unreacted monomers were removed under evacuation till 2 mmHg at 150° C. to obtain Polymer 1 as shown below.

Molecular weight (Mw) and dispersibility (Mw/Mn) thereof were obtained by GPC, and the following ratio in the polymer was obtained by the $^1$H-NMR analysis.

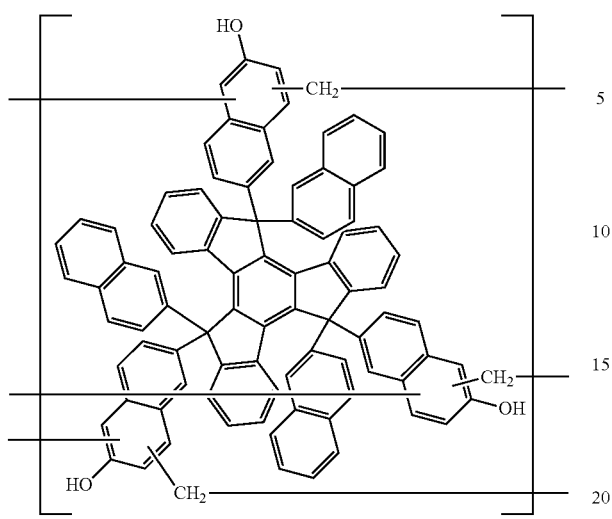

Truxene Novolak Polymer 1 (Mw: 5600, Mw/Mn: 6.10)

Comparative Synthesis Example 1

Comparative Polymer 1

In a 300-mL flask, 200 g of fluorene bisphenol, 75 g of 37% aqueous formalin, and 5 g of oxalic acid were mixed; and then the resulting mixture was stirred at 100° C. for 24 hours. After the reaction, the reaction solution was dissolved into 500 mL of methyl isobutyl ketone; and then, the catalyst and metal impurities were removed with sufficient washing by water. After removal of the solvent under reduced pressure, water and unreacted monomers were removed under evacuation till 2 mmHg at 150° C. to obtain 135 g of Comparative Polymer 1 as shown below.

Molecular weight (Mw) and dispersibility (Mw/Mn) thereof were obtained by GPC, and the following ratio in the polymer was obtained by the $^1$H-NMR analysis.

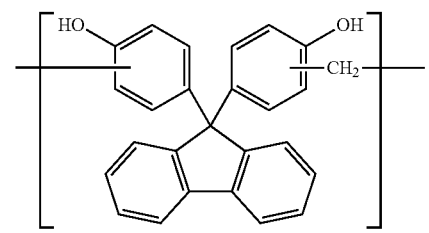

Comparative Polymer 1 (Mw: 6500, Mw/Mn: 5.20)

As Comparative Polymer 2, m-cresol novolak resin having Mw of 8800 and Mw/Mn of 4.5 was used. As Comparative Polymer 3, polyhydroxy styrene having Mw of 9200 and Mw/Mn of 1.05 was used.

As Comparative Monomers 1 to 4, the compounds as shown below were used.

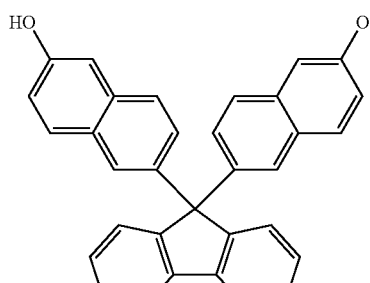
Comparative monomer 1

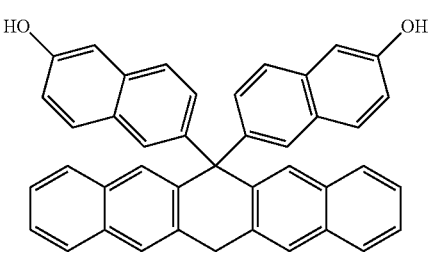
Comparative monomer 2

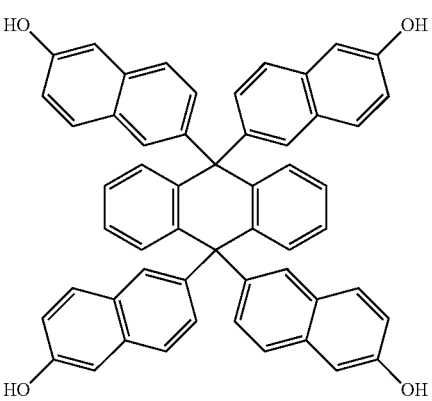
Comparative monomer 3

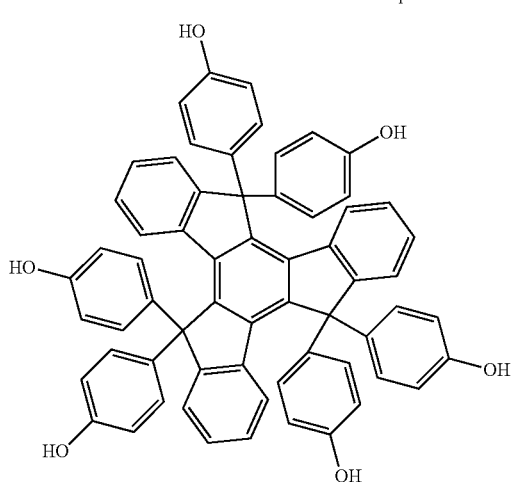
Comparative monomer 4

<Preparation of Resist Underlayer Film Composition and Resist Intermediate Film Composition>

Each of Naphthol Truxenes 1 to 4, Truxene Novolak Polymer 1, Comparative Polymers 1 to 3, Comparative Monomers 1 to 4, a silicon-containing intermediate film polymer for ArF which will be mentioned later, Blend Polymers 1 to 2, an acid generator shown by AG1, and a crosslinking agent shown by CR1 were dissolved in a solvent containing 0.1% by mass of FC-4430 (manufactured by Sumitomo 3M Limited) with the mixing ratio shown in Table 1; and then, the resulting mixture was passed through a 0.1-μm filter made of a fluorinated resin to obtain each of the resist underlayer film solutions (UDL-1 to UDL-8, and Comparative UDL-1 to UDL-7) and a resist intermediate film solution (SOG-1).

Measurement of Refractive Index

Examples 1-1 to 1-8 and Comparative Examples 1-1 to 1-8

The resist underlayer film solution obtained as mentioned above (UDL-1 to UDL-8 and Comparative UDL-1 to UDL-7) was applied onto a silicon substrate and baked at 350° C. for 60 seconds for UDL-1 to UDL-8 and Comparative UDL-1 and Comparative UDL-4 to UDL-7 and at 230° C. for 60 seconds for Comparative UDL-2, Comparative UDL-3, and SOG-1 to obtain respective underlayer films having film thickness of 200 nm and the SOG film having film thickness of 35 nm. Refractive indexes (n and k) of each of UDL-1 to UDL-7, Comparative UDL-1 to UDL-8, and SOG-1 at 193 nm were measured with a spectroscopic ellipsometer (VASE; variable incident light angle type, manufactured by J. A. Woolam, Co., Inc.); and the results thereof are shown in Table 1.

TABLE 1

| | No. | Compound (Parts by mass) | Crosslinking agent (part by mass) | Acid generator (part by mass) | Solvent (part by mass) | Refractive index (193 nm) n-value | k-value |
|---|---|---|---|---|---|---|---|
| Example 1-1 | UDL-1 | Naphthol Truxene 1 (30) | — | — | PGMEA(70) Cyclohexanone (30) | 1.38 | 0.44 |
| Example 1-2 | UDL-2 | Naphthol Truxene 2 (30) | — | — | Cyclohexanone (100) | 1.41 | 0.46 |
| Example 1-3 | UDL-3 | Naphthol Truxene 3 (30) | — | — | Cyclohexanone (100) | 1.4 | 0.48 |
| Example 1-4 | UDL-4 | Naphthol Truxene 4 (30) | — | — | Cyclohexanone (100) | 1.38 | 0.43 |
| Example 1-5 | UDL-5 | Naphthol Truxene 1(20) Blend Polymer 1(10) | — | — | PGMEA(70) Cyclohexanone (30) | 1.37 | 0.44 |
| Example 1-6 | UDL-6 | Naphthol Truxene 1(20) Blend Polymer 2(10) | — | — | PGMEA(70) Cyclohexanone (30) | 1.37 | 0.44 |
| Example 1-7 | UDL-7 | Truxene Novolak Polymer 1(30) | — | — | PGMEA(30) Cyclohexanone (70) | 1.38 | 0.42 |
| Example 1-8 | UDL-8 | Truxene Novolak Polymer 1(30) | CR1 (5) | AG1 (1) | PGMEA(30) Cyclohexanone (70) | 1.41 | 0.42 |
| Comparative Example 1-1 | Comparative Example UDL-1 | Comparative Polymer 1(28) | — | — | PGMEA(70) Cyclohexanone (30) | 1.4 | 0.71 |
| Comparative Example 1-2 | Comperative Example UDL-2 | Comparative Polymer 2 (28) | CR1 (5) | AG1 (1) | PGMEA (100) | 142 | 0.68 |
| Comparative Example 1-3 | Comparative Example UDL-3 | Comparative Polymer 3 (28) | CR1 (5) | AG1 (1) | PGMEA (100) | 1.62 | 0.82 |
| Comparative Example 1-4 | Comparative Example UDL-4 | Comparative Monomer 1 (32) | — | — | PGMEA (100) | 1.33 | 0.44 |
| Comparative Example 1-5 | Comparative Example UDL-5 | Comparative Monomer 2 (32) | — | — | PGMEA (100) | 1.32 | 0.45 |
| Comparative Example 1-6 | Comparative Example UDL-6 | Comparative Monomer 3 (32) | — | — | PGMEA (100) | 1.34 | 0.41 |
| Comparative Example 1-7 | Comparative Example UDL-7 | Comparative Monomer 4 (30) | — | — | PGMEA (100) | 1.35 | 0.80 |
| Comparative Example 1-8 | SOG-1 | ArF Silicon containing intermediate layer polymer 1 (10) | — | — | PGMEA (200) | 1.68 | 0.15 |

As shown in Table 1, the resist underlayer film formed by using the resist underlayer film composition of the present invention has refractive indexes which fully satisfy as a practical underlayer film for the trilayer process of an immersion lithography. From this, it was confirmed that these have a function as the bottom antirefrective coating.

AG1 used as an acid generator and CR1 used as a crosslinking agent shown in Table 1 as shown below was used.

AG1

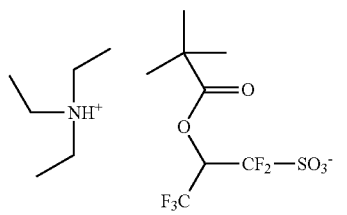

CR1

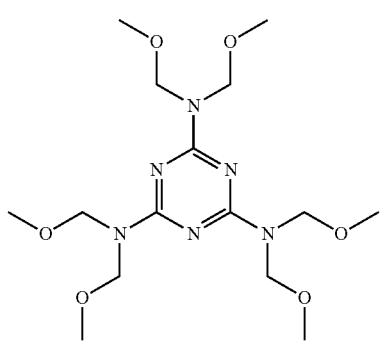

As Blend Polymers 1 to 2, the following polymers for blending (Blend Polymer 1 and Blend Polymer 2) were used.

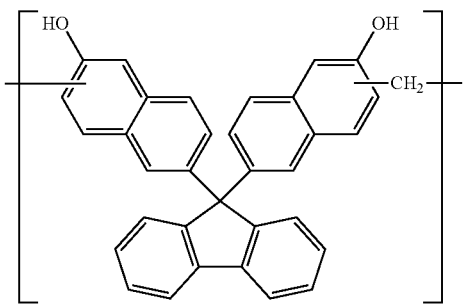

Blend Polymer 1 (Mw: 2,900, Dispersivity (Mw/Mn): 4.20)

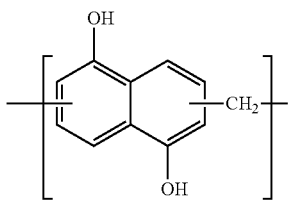

Blend Polymer 2 (Mw: 3,600, Mw/Mn: 4.50)

In addition, as ArF Silicon-containing intermediate film polymer, the following polymer was used.

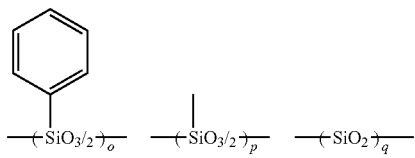

ArF Silicon-containing intermediate film polymer (o=0.20, p=0.50, q=0.30 μM$_w$=3,400)

Measurement of Solvent Resistance

Examples 2-1 to 2-10 and Comparative Examples 2-1 to 2-7

Each of UDL-1 to UDL-8 and Comparative UDL-1 to UDL-7 was applied onto a silicon substrate and baked in an air for 60 seconds at the temperature shown in Table 2 to measure the film thickness thereof; and then, after a PGMEA solution was dispensed thereon, it was allowed to stand for 30 seconds. After spin-dry, it was baked at 100° C. for 60 seconds to evaporate PGMEA to measure the film thickness thereof. Difference of the film thicknesses between before and after the PGMEA treatment is shown in Table 2.

TABLE 2

| | The resist underlayer film solution | Baking temperature (° C.) | Film reduction by solvent treatment (nm) |
|---|---|---|---|
| Example 2-1 | UDL-1 | 350 | 3 |
| Example 2-2 | UDL-1 | 400 | 2 |
| Example 2-3 | UDL-1 | 450 | 1 |
| Example 2-4 | UDL-2 | 350 | 2 |
| Example 2-5 | UDL-3 | 350 | 3 |
| Example 2-6 | UDL-4 | 350 | 3 |
| Example 2-7 | UDL-5 | 350 | 2 |
| Example 2-8 | UDL-6 | 350 | 2 |
| Example 2-9 | UDL-7 | 350 | 2 |
| Example 2-10 | UDL-8 | 350 | 2 |
| Comparative Example 2-1 | Comparative Example UDL-1 | 350 | 9 |
| Comparative Example 2-2 | Comparative Example UDL-2 | 230 | 6 |
| Comparative Example 2-3 | Comparative Example UDL-3 | 230 | 8 |
| Comparative Example 2-4 | Comparative Example UDL-4 | 350 | 8 |
| Comparative Example 2-5 | Comparative Example UDL-5 | 350 | 6 |
| Comparative Example 2-6 | Comparative Example UDL-6 | 350 | 4 |
| Comparative Example 2-7 | Comparative Example UDL-7 | 350 | 3 |

As shown in Table 2, the resist underlayer film composition of the present invention forms a film not soluble in a solvent by heating the resin alone at 300° C. or higher. From this, it was confirmed that the resist underlayer film composition of the present invention can form a resist underlayer film having a high solvent resistance.

Etching Tests in CF$_4$/CHF$_3$ Gas System

Examples 3-1 to 3-8 and Comparative Examples 3-1 to 3-7

Film loss before and after etching was measured by using an etching instrument TE-8500 (manufactured by Tokyo Electron Limited). Etching condition is as following.
Chamber pressure: 40.0 Pa
RF power: 1,300 W CHF$_3$ gas flow rate: 30 mL/minute
CF$_4$ gas flow rate: 30 mL/minute
Ar gas flow rate: 100 mL/minute
Time: 60 seconds Each of the resist underlayer film compositions (UDL-1 to UDL-8 and Comparative UDL-1 to UDL-7) was applied onto a silicon substrate, and then baked at 350° C. for 60 seconds for UDL-1 to UDL-8, Comparative UDL-1, and Comparative UDL-4 to Comparative UDL-7, and at 230° C. for 60 seconds for Comparative UDL-2 and Comparative UDL-3 to obtain respective resist underlayer films having film thickness of 200 nm. The etching tests thereof in CF$_4$/CHF$_3$ gas system were carried out with the condition shown below. Difference in film thickness of the polymer film between before and after etching was measured by using an etching instrument TE-8500 (manufactured by Tokyo Electron Limited). The results thereof are shown in Table 3.

TABLE 3

| | The resist underlayer film solution | Film reduction by CF$_4$/CHF$_3$ gas etching (nm) |
|---|---|---|
| Example 3-1 | UDL-1 | 71 |
| Example 3-2 | UDL-2 | 75 |
| Example 3-3 | UDL-3 | 67 |
| Example 3-4 | UDL-4 | 62 |
| Example 3-5 | UDL-5 | 63 |
| Example 3-6 | UDL-6 | 78 |
| Example 3-7 | UDL-7 | 72 |
| Example 3-8 | UDL-8 | 77 |
| Comparative Example 3-1 | Comparative Example UDL-1 | 98 |
| Comparative Example 3-2 | Comparative Example UDL-2 | 119 |
| Comparative Example 3-3 | Comparative Example UDL-3 | 130 |
| Comparative Example 3-4 | Comparative Example UDL-4 | 80 |
| Comparative Example 3-5 | Comparative Example UDL-5 | 82 |
| Comparative Example 3-6 | Comparative Example UDL-6 | 78 |
| Comparative Example 3-7 | Comparative Example UDL-7 | 95 |

As shown in Table 3, etching rate of the resist underlayer film formed by the resist underlayer film composition of the present invention in CF$_4$/CHF$_3$ gas system is adequately slower as compared with the novolak resin and polyhydroxy styrene, and thus has a very high etching resistance.

Pattern Etching Tests

Examples 4-1 to 4-8 and Comparative Examples 4-1 to 4-7

Each of the underlayer film composition solutions (UDL-1 to UDL-8 and Comparative UDL-1 to UDL-7) was applied onto a 300-mm Si wafer coated with a 200-nm SiO$_2$ film, and then baked at 350° C. for 60 seconds in Examples 4-1 to 4-8, Comparative Example 4-1, and Comparative Examples 4-4 to 4-7 to obtain respective underlayer films having film thickness of 200 nm. In Comparative Examples 4-2 and 4-3, baking was done at 230° C. for 60 seconds to obtain respective underlayer films having film thickness of 200 nm. Meanwhile, baking of each underlayer film was done in an air atmosphere.

Thereupon, the silicon-containing intermediate film composition solution SOG 1 was applied and then baked at 200° C. for 60 seconds to form the intermediate film having film thickness of 35 nm; thereafter, the resist solution for ArF shown in Table 4 was applied and then baked at 105° C. for 60 seconds to form the photoresist film having film thickness of 100 nm. Then, onto the photoresist film was applied the top coat solution for immersion (TC-1) shown in Table 5 and baked at 90° C. for 60 seconds to form the top coat having film thickness of 50 nm.

Then, after exposure was done with an ArF immersion exposure instrument NSR-S610C (manufactured by Nikon Corp.; NA of 1.30, σ of 0.98/0.65, 35-degree dipole polarized illumination, and 6% half tone phase shift mask), baking was done at 100° C. for 60 seconds (PEB) followed by development with an aqueous tetramethyl ammonium hydroxide (TMAH) with the concentration thereof being 2.38% by mass for 30 seconds to form a positive 43 nm 1:1 line-and-space pattern.

Next, by using an etching instrument Telius (manufactured by Tokyo Electron Limited), the silicon-containing intermediate film (SOG) was processed by using the resist pattern by dry etching as a mask, the underlayer film was processed by using the silicon-containing intermediate film as a mask, and the SiO$_2$ film was processed by using the underlayer film as a mask. The results are shown in Table 6.

The ArF resist solution was prepared by dissolving a polymer, a PAG, and a quencher, structures thereof being shown below, into a solvent containing 0.1% by mass of FC-4430 (manufactured by Sumitomo 3M Limited) with the composition ratio of the resin, the acid generator, and the basic compound as shown in Table 4; and then, the resulting mixture was passed through a 0.1-μm filter made of a fluorinated resin.

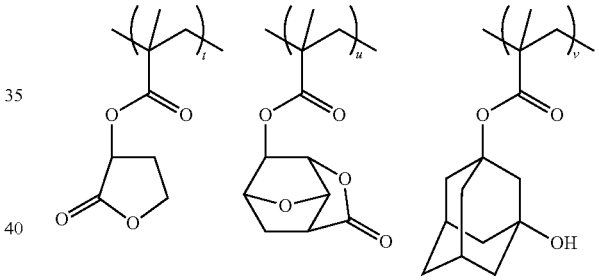

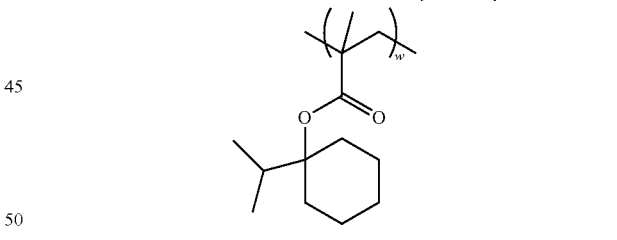

ArF monolayer resist polymer 1 (t=0.20, u=0.20, v=0.10, w=0.40, and Mw=8,800)

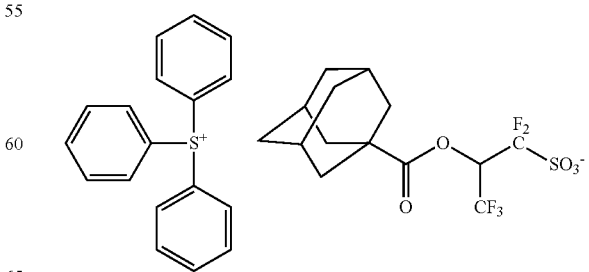

PAG1

-continued

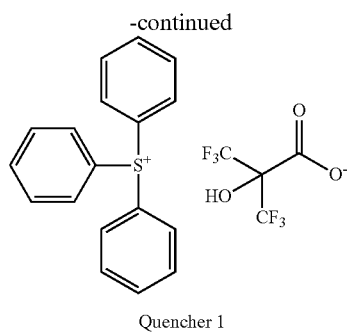

Quencher 1

TABLE 4

| No. | Polymer (parts by mass) | Acid generator (parts by mass) | Quencher (parts by mass) | Solvent (parts by mass) |
|---|---|---|---|---|
| Resist for ArF | ArF monolayer resist polymer 1 (100) | PAG 1 (5.5) | Quencher 1 (4.5) | PGMEA (2,800) |

The top coat solution for immersion (TC-1) was prepared by dissolving the resin with the composition shown in Table 5 was dissolved in a solvent, followed by filtration of the resulting solution through a 0.1-μm filter made of a fluorinated resin.

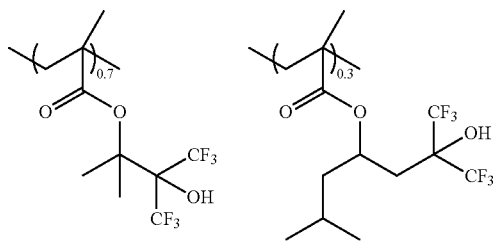

Top coat polymer (Mw: 8800, Mw/Mn: 1.69)

TABLE 5

| No. | Polymer (parts by mass) | Organic solvent (parts by mass) |
|---|---|---|
| TC-1 | Top coat polymer (100) | Diisoamyl ether (2,700) |
| | | 2-methyl-1-butanol (270) |

Etching conditions are as following.

Transcription conditions of a resist pattern to a SOG film:
Chamber pressure: 10.0 Pa
RF power: 1,500 W
$CF_4$ gas flow rate: 15 sccm
$O_2$ gas flow rate: 75 sccm
Time: 15 seconds Transcription conditions of a SOG film to an underlayer film:
Chamber pressure: 2.0 Pa
RF power: 500 W
Ar gas flow rate: 74 sccm
$O_2$ gas flow rate: 45 sccm
Time: 120 seconds Transcription conditions of a resist underlayer film to a $SiO_2$ film:
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$: 60 sccm
Time: 90 seconds A pattern cross-section was observed with an electron microscope S-4700 (manufactures by Hitachi, Ltd.), and pattern profile were compared. The results are shown in Table 6.

TABLE 6

| | The resist underlayer film solution | The upper resist | Pattern profile after development | Profile after transcription etching of intermediate layer | Profile after transcription etching of underlayer film | Profile after transcription etching of substrate | Pattern twist after transcription etching of substrate |
|---|---|---|---|---|---|---|---|
| Example 4-1 | UDL-1 | Resist for ArF | Vertical profile | Vertical profile | Vertical profile | Vertical profile | No |
| Example 4-2 | UDL-2 | Resist for ArF | Vertical profile | Vertical profile | Vertical profile | Vertical profile | No |
| Example 4-3 | UDL-3 | Resist for ArF | Vertical profile | Vertical profile | Vertical profile | Vertical profile | No |
| Example 4-4 | UDL-4 | Resist for ArF | Vertical profile | Vertical profile | Vertical profile | Vertical profile | No |
| Example 4-5 | UDL-5 | Resist for ArF | Vertical profile | Vertical profile | Vertical profile | Vertical profile | No |
| Example 4-6 | UDL-6 | Resist for ArF | Vertical profile | Vertical profile | Vertical profile | Vertical profile | No |
| Example 4-7 | UDL-7 | Resist for ArF | Vertical profile | Vertical profile | Vertical profile | Vertical profile | No |
| Example 4-8 | UDL-8 | Resist for ArF | Vertical profile | Vertical profile | Vertical profile | Vertical profile | No |
| Comparative Example 4-1 | Comparative Example UDL-1 | Resist for ArF | Vertical profile | Vertical profile | Vertical profile | Tapered profile and film reduction | Yes |

TABLE 6-continued

| | The resist underlayer film solution | The upper resist | Pattern profile after development | Profile after transcription etching of intermediate layer | Profile after transcription etching of underlayer film | Profile after transcription etching of substrate | Pattern twist after transcription etching of substrate |
|---|---|---|---|---|---|---|---|
| Comparative Example 4-2 | Comparative Example UDL-2 | Resist for ArF | Vertical profile | Vertical profile | Vertical profile | Tapered profile | Yes |
| Comparative Example 4-3 | Comparative Example UDL-3 | Resist for ArF | Vertical profile | Vertical profile | Vertical profile | Tapered profile | Yes |
| Comparative Example 4-4 | Comparative Example UDL-4 | Resist for ArF | Vertical profile | Vertical profile | Vertical profile | Vertical profile | Yes (partially) |
| Comparative Example 4-5 | Comparative Example UDL-5 | Resist for ArF | Vertical profile | Vertical profile | Vertical profile | Vertical profile | Yes (partially) |
| Comparative Example 4-6 | Comparative Example UDL-6 | Resist for ArF | Vertical profile | Vertical profile | Vertical profile | Vertical profile | Yes (partially) |
| Comparative Example 4-7 | Comparative Example UDL-7 | Resist for ArF | Vertical profile | Vertical profile | Vertical profile | Vertical profile | Yes (partially) |

As shown in Table 6, it was confirmed that the resist after development and the underlayer film after oxygen etching and substrate etching had excellent forms with no pattern twist.

Measurement of Outgoing Gas

Examples 5-1 to 5-2 and Comparative Examples 5-1 to 5-4

Each of UDL-1, UDL-6, and Comparative UDL-4 to UDL-7 was applied onto a Si substrate. Then, under the condition to form the underlayer film having the film thickness of 200 nm by baking at 350° C. for 60 seconds, number of particles having the size of 0.3 μm and 0.5 μm generated during baking in a hot plate oven at 350° C. were measured with a particle counter KR-11A (manufactured by RION Co., Ltd.). The results thereof are shown in Table 7.

TABLE 7

| | The resist underlayer film solution | Number of particles having the size of 0.3 μm | Number of particles having the size of 0.5 μm |
|---|---|---|---|
| Example 5-1 | UDL-1 | 5 | 1 |
| Example 5-2 | UDL-6 | 0 | 0 |
| Comparative Example 5-1 | Comparative Example UDL-4 | About 500,000 | About 200,000 |
| Comparative Example 5-2 | Comparative Example UDL-5 | About 500,000 | About 200,000 |
| Comparative Example 5-3 | Comparative Example UDL-6 | About 200,000 | About 100,000 |
| Comparative Example 5-4 | Comparative Example UDL-7 | 10 | 2 |

As shown in Table 7, it was confirmed that the resist underlayer film composition of the present invention does not generate particles during baking so that fouling of a baking equipment can be avoided. From this, it is shown that generation of outgoing gas can be suppressed during baking at the time of forming the resist underlayer film by using the resist underlayer film composition of the present invention.

It must be stated here that the present invention is not limited to the above-mentioned embodiments. The embodiments shown above are mere examples so that any embodiment composed of substantially the same technical concept as disclosed in the claims of the present invention and expressing a similar effect is included in the technical scope of the present invention.

What is claimed is:

1. A resist underlayer film composition, the resist underlayer film composition used in a patterning process to form a pattern on a substrate wherein a resist underlayer film is formed on the substrate by using the resist underlayer film composition, at least a resist upper layer film is formed on the resist underlayer film by using a photoresist composition, after the resist upper layer film is exposed and developed to form a pattern, the pattern formed on the resist upper layer film is transferred to the resist underlayer film, and then the pattern transferred to the resist underlayer film is transferred to the substrate; wherein the resist underlayer film composition contains a truxene compound having a substituted or an unsubstituted naphthol group as shown by the following general formula (1),

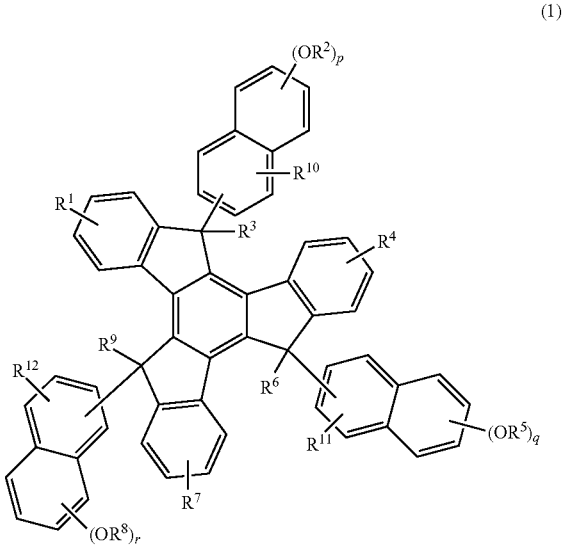

provided that: in the general formula (1), $R^1$, $R^4$, $R^7$, $R^{10}$, $R^{11}$, and $R^{12}$ represent the same or different groups of a hydrogen atom, a linear, a branched, or a cyclic alkyl group having 1 to 10 carbon atoms, an aryl group having 6 to 10 carbon atoms, an alkenyl group having 2 to 10 carbon atoms, a hydroxy group, an alkoxy group, an acyloxy group, a cyano group, a nitro group, an amino group, or a halogen atom; $R^2$, $R^5$, and $R^9$ represent the same or different groups of a hydrogen atom, a linear, a branched, or a cyclic alkyl group having 1 to 6 carbon atoms, an acyl group, a glycidyl group, or an acid-labile group; $R^3$, $R^6$, and $R^9$ represent the same or different groups of a hydrogen atom, a hydroxy group, a linear, a branched, or a cyclic alkyl group having 1 to 10 carbon atoms, an alkoxy group, an alkenyl group having 2 to 10 carbon atoms, an alkynyl group having 2 to 10 carbon atoms, or an aryl group having 6 to 20 carbon atoms; and p, q, and r represent an integer of 1 to 6.

2. The resist underlayer film composition according to claim 1, wherein an organic solvent is further contained therein.

3. The resist underlayer film composition according to claim 2, wherein a crosslinking agent and an acid generator are further contained therein.

4. A patterning process, the patterning process to form a pattern on a substrate by a lithography, wherein, at least, a resist underlayer film is formed on the substrate by using the resist underlayer film composition according to claim 3, a resist intermediate film is formed on the resist underlayer film by using a silicon-containing resist intermediate film composition, a resist upper layer film is formed on the resist intermediate film by using a resist upper layer film material which is a photoresist composition, and after a pattern circuit area of the resist upper layer film is exposed, a resist pattern is formed on the resist upper layer film by developing with a developer, the resist intermediate film is etched by using the resist upper layer film formed with the resist pattern as a mask to form a pattern, the resist underlayer film is etched by using the resist intermediate film formed with the pattern as a mask to form a pattern, and further the substrate is etched by using the resist underlayer film formed with the pattern as a mask to form a pattern on the substrate.

5. A patterning process, the patterning process to form a pattern on a substrate by a lithography, wherein, at least, a resist underlayer film is formed on the substrate by using the resist underlayer film composition according to claim 3, an inorganic hard mask intermediate film comprising any of a silicon oxide film, a silicon nitride film, and a silicon oxynitride film is formed on the resist underlayer film, a resist upper layer film is formed on the inorganic hard mask intermediate film by using a resist upper layer film material which is a photoresist composition, and after a pattern circuit area of the resist upper layer film is exposed, a resist pattern is formed on the resist upper layer film by developing with a developer, the inorganic hard mask intermediate film is etched by using the resist upper layer film formed with the resist pattern as a mask to form a pattern, the resist underlayer film is etched by using the inorganic hard mask intermediate film formed with the pattern as a mask to form a pattern, and further the substrate is etched by using the resist underlayer film formed with the pattern as a mask to form a pattern on the substrate.

6. A patterning process, the patterning process to form a pattern on a substrate by a lithography, wherein, at least, a resist underlayer film is formed on the substrate by using the resist underlayer film composition according to claim 3, an inorganic hard mask intermediate film comprising any of a silicon oxide film, a silicon nitride film, and a silicon oxynitride film is formed on the resist underlayer film, an organic bottom antirefrective coating (BARC) is formed on the inorganic hard mask intermediate film, a resist upper layer film is formed on the BARC film to form a four-layer resist film by using a resist upper layer film material which is a photoresist composition, and after a pattern circuit area of the resist upper layer film is exposed, a resist pattern is formed on the resist upper layer film by developing with a developer, the BARC film and the inorganic hard mask intermediate film are etched by using the resist upper layer film formed with the resist pattern as a mask to form a pattern on the inorganic hard mask intermediate film, the resist underlayer film is etched by using the inorganic hard mask intermediate film formed with the pattern as a mask to form a pattern, and further the substrate is etched by using the resist underlayer film formed with the pattern as a mask to form a pattern on the substrate.

7. A patterning process, the patterning process to form a pattern on a substrate by a lithography, wherein, at least, a resist underlayer film is formed on the substrate by using the resist underlayer film composition according to claim 2, a resist intermediate film is formed on the resist underlayer film by using a silicon-containing resist intermediate film composition, a resist upper layer film is formed on the resist intermediate film by using a resist upper layer film material which is a photoresist composition, and after a pattern circuit area of the resist upper layer film is exposed, a resist pattern is formed on the resist upper layer film by developing with a developer, the resist intermediate film is etched by using the resist upper layer film formed with the resist pattern as a mask to form a pattern, the resist underlayer film is etched by using the resist intermediate film formed with the pattern as a mask to form a pattern, and further the substrate is etched by using the resist underlayer film formed with the pattern as a mask to form a pattern on the substrate.

8. A patterning process, the patterning process to form a pattern on a substrate by a lithography, wherein, at least, a resist underlayer film is formed on the substrate by using the resist underlayer film composition according to claim 2, an inorganic hard mask intermediate film comprising any of a silicon oxide film, a silicon nitride film, and a silicon oxynitride film is formed on the resist underlayer film, a resist upper layer film is formed on the inorganic hard mask intermediate film by using a resist upper layer film material which is a photoresist composition, and after a pattern circuit area of the resist upper layer film is exposed, a resist pattern is formed on the resist upper layer film by developing with a developer, the inorganic hard mask intermediate film is etched by using the resist upper layer film formed with the resist pattern as a mask to form a pattern, the resist underlayer film is etched by using the inorganic hard mask intermediate film formed with the pattern as a mask to form a pattern, and further the substrate is etched by using the resist underlayer film formed with the pattern as a mask to form a pattern on the substrate.

9. A patterning process, the patterning process to form a pattern on a substrate by a lithography, wherein, at least, a resist underlayer film is formed on the substrate by using the resist underlayer film composition according to claim 2, an inorganic hard mask intermediate film comprising any of a silicon oxide film, a silicon nitride film, and a silicon oxynitride film is formed on the resist underlayer film, an organic bottom antirefrective coating (BARC) is formed on the inorganic hard mask intermediate film, a resist upper layer film is formed on the BARC film to form a four-layer resist film by using a resist upper layer film material which is a photoresist composition, and after a pattern circuit area of the resist upper layer film is exposed, a resist pattern is formed on the resist upper layer film by developing with a developer, the BARC film and the inorganic hard mask intermediate film are etched by using the resist upper layer film formed with the resist pattern as a mask to form a pattern on the inorganic hard mask intermediate film, the resist underlayer film is etched by using the inorganic hard mask intermediate film formed with the pattern as a mask to form a pattern, and further the substrate is etched by using the resist underlayer film formed with the pattern as a mask to form a pattern on the substrate.

10. The resist underlayer film composition according to claim 1, wherein a crosslinking agent and an acid generator are further contained therein.

11. A patterning process, the patterning process to form a pattern on a substrate by a lithography, wherein, at least, a resist underlayer film is formed on the substrate by using the resist underlayer film composition according to claim 10, a resist intermediate film is formed on the resist underlayer film by using a silicon-containing resist intermediate film composition, a resist upper layer film is formed on the resist intermediate film by using a resist upper layer film material which is a photoresist composition, and after a pattern circuit area of the resist upper layer film is exposed, a resist pattern is formed on the resist upper layer film by developing with a developer, the resist intermediate film is etched by using the resist upper layer film formed with the resist pattern as a mask to form a pattern, the resist underlayer film is etched by using the resist intermediate film formed with the pattern as a mask to form a pattern, and further the substrate is etched by using the resist underlayer film formed with the pattern as a mask to form a pattern on the substrate.

12. A patterning process, the patterning process to form a pattern on a substrate by a lithography, wherein, at least, a resist underlayer film is formed on the substrate by using the resist underlayer film composition according to claim 10, an inorganic hard mask intermediate film comprising any of a silicon oxide film, a silicon nitride film, and a silicon oxynitride film is formed on the resist underlayer film, a resist upper layer film is formed on the inorganic hard mask intermediate film by using a resist upper layer film material which is a photoresist composition, and after a pattern circuit area of the resist upper layer film is exposed, a resist pattern is formed on the resist upper layer film by developing with a developer, the inorganic hard mask intermediate film is etched by using the resist upper layer film formed with the resist pattern as a mask to form a pattern, the resist underlayer film is etched by using the inorganic hard mask intermediate film formed with the pattern as a mask to form a pattern, and further the substrate is etched by using the resist underlayer film formed with the pattern as a mask to form a pattern on the substrate.

13. A patterning process, the patterning process to form a pattern on a substrate by a lithography, wherein, at least, a resist underlayer film is formed on the substrate by using the resist underlayer film composition according to claim 10, an inorganic hard mask intermediate film comprising any of a silicon oxide film, a silicon nitride film, and a silicon oxynitride film is formed on the resist underlayer film, an organic bottom antirefrective coating (BARC) is formed on the inorganic hard mask intermediate film, a resist upper layer film is formed on the BARC film to form a four-layer resist film by using a resist upper layer film material which is a photoresist composition, and after a pattern circuit area of the resist upper layer film is exposed, a resist pattern is formed on the resist upper layer film by developing with a developer, the BARC film and the inorganic hard mask intermediate film are etched by using the resist upper layer film formed with the resist pattern as a mask to form a pattern on the inorganic hard mask intermediate film, the resist underlayer film is etched by using the inorganic hard mask intermediate film formed with the pattern as a mask to form a pattern, and further the substrate is etched by using the resist underlayer film formed with the pattern as a mask to form a pattern on the substrate.

14. A patterning process, the patterning process to form a pattern on a substrate by a lithography, wherein, at least, a resist underlayer film is formed on the substrate by using the resist underlayer film composition according to claim 1, a resist intermediate film is formed on the resist underlayer film by using a silicon-containing resist intermediate film composition, a resist upper layer film is formed on the resist intermediate film by using a resist upper layer film material which is a photoresist composition, and after a pattern circuit area of the resist upper layer film is exposed, a resist pattern is formed on the resist upper layer film by developing with a developer, the resist intermediate film is etched by using the resist upper layer film formed with the resist pattern as a mask to form a pattern, the resist underlayer film is etched by using the resist intermediate film formed with the pattern as a mask to form a pattern, and further the substrate is etched by using the resist underlayer film formed with the pattern as a mask to form a pattern on the substrate.

15. A patterning process, the patterning process to form a pattern on a substrate by a lithography, wherein, at least, a resist underlayer film is formed on the substrate by using the resist underlayer film composition according to claim 1, an inorganic hard mask intermediate film comprising any of a silicon oxide film, a silicon nitride film, and a silicon oxynitride film is formed on the resist underlayer film, a resist upper layer film is formed on the inorganic hard mask intermediate film by using a resist upper layer film material which is a photoresist composition, and after a pattern circuit area of the resist upper layer film is exposed, a resist pattern is formed on the resist upper layer film by developing with a developer, the inorganic hard mask intermediate film is etched by using the resist upper layer film formed with the resist pattern as a mask to form a pattern, the resist underlayer film is etched by using the inorganic hard mask intermediate film formed with the pattern as a mask to form a pattern, and further the substrate is etched by using the resist underlayer film formed with the pattern as a mask to form a pattern on the substrate.

16. The patterning process according to claim 15, wherein, in formation of the inorganic hard mask intermediate film, the inorganic hard mask intermediate film comprising any of the silicon oxide film, the silicon nitride film, and the silicon oxynitride film is formed by a CVD method or an ALD method.

17. The patterning process according to claim 16, wherein, in formation of the resist upper layer film, the resist upper layer film is formed by using the resist upper layer film material which is the photoresist composition not containing a silicon-containing polymer, and in etching of the resist underlayer film, the resist underlayer film is etched by an etching gas system mainly comprising an oxygen gas or a hydrogen gas by using the resist intermediate film formed with the pattern or the inorganic hard mask intermediate film formed with the pattern as a mask.

18. The patterning process according to claim 15, wherein, in formation of the resist upper layer film, the resist upper layer film is formed by using the resist upper layer film material which is the photoresist composition not containing a silicon-containing polymer, and in etching of the resist underlayer film, the resist underlayer film is etched by an etching gas system mainly comprising an oxygen gas or a hydrogen gas by using the resist intermediate film formed with the pattern or the inorganic hard mask intermediate film formed with the pattern as a mask.

19. A patterning process, the patterning process to form a pattern on a substrate by a lithography, wherein, at least, a resist underlayer film is formed on the substrate by using the resist underlayer film composition according to claim 1, an inorganic hard mask intermediate film comprising any of a silicon oxide film, a silicon nitride film, and a silicon oxynitride film is formed on the resist underlayer film, an organic bottom antirefrective coating (BARC) is formed on the inorganic hard mask intermediate film, a resist upper layer film is formed on the BARC film to form a four-layer resist film by using a resist upper layer film material which is a photoresist composition, and after a pattern circuit area of the resist upper layer film is exposed, a resist pattern is formed on the resist upper layer film by developing with a developer, the BARC film and the inorganic hard mask intermediate film are etched by using the resist upper layer film formed with the resist pattern as a mask to form a pattern on the inorganic hard mask intermediate film, the resist underlayer film is etched by using the inorganic hard mask intermediate film formed with the pattern as a mask to form a pattern, and further the substrate is etched by using the resist underlayer film formed with the pattern as a mask to form a pattern on the substrate.

20. The patterning process according to claim 19, wherein, in formation of the inorganic hard mask intermediate film, the inorganic hard mask intermediate film comprising any of the silicon oxide film, the silicon nitride film, and the silicon oxynitride film is formed by a CVD method or an ALD method.

21. The patterning process according to claim 20, wherein, in formation of the resist upper layer film, the resist upper layer film is formed by using the resist upper layer film material which is the photoresist composition not containing a silicon-containing polymer, and in etching of the resist underlayer film, the resist underlayer film is etched by an etching gas system mainly comprising an oxygen gas or a hydrogen gas by using the resist intermediate film formed with the pattern or the inorganic hard mask intermediate film formed with the pattern as a mask.

22. The patterning process according to claim 19, wherein, in formation of the resist upper layer film, the resist upper layer film is formed by using the resist upper layer film material which is the photoresist composition not containing a silicon-containing polymer, and in etching of the resist underlayer film, the resist underlayer film is etched by an etching gas system mainly comprising an oxygen gas or a hydrogen gas by using the resist intermediate film formed with the pattern or the inorganic hard mask intermediate film formed with the pattern as a mask.

* * * * *